(12) United States Patent
Shinozaki

(10) Patent No.: US 10,636,665 B2
(45) Date of Patent: Apr. 28, 2020

(54) DRESSING DEVICE, POLISHING APPARATUS, HOLDER, HOUSING AND DRESSING METHOD

(71) Applicant: EBARA CORPORATION, Tokyo (JP)

(72) Inventor: Hiroyuki Shinozaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/675,442

(22) Filed: Aug. 11, 2017

(65) Prior Publication Data

US 2018/0047572 A1     Feb. 15, 2018

(30) Foreign Application Priority Data

Aug. 12, 2016  (JP) ................................ 2016-158456

(51) Int. Cl.
*H01L 21/304* (2006.01)
*B24B 37/04* (2012.01)
*B24B 37/10* (2012.01)
*B24B 37/16* (2012.01)
*B24B 53/017* (2012.01)

(52) U.S. Cl.
CPC ............ *H01L 21/304* (2013.01); *B24B 37/04* (2013.01); *B24B 37/10* (2013.01); *B24B 37/16* (2013.01); *B24B 53/017* (2013.01)

(58) Field of Classification Search
None
See application file for complete search history.

(56) References Cited

U.S. PATENT DOCUMENTS

| 4,222,204 A * | 9/1980 | Benner ................. B24D 9/085 15/230 |
| 5,885,137 A * | 3/1999 | Ploessl .................... B24B 37/04 451/443 |
| 6,099,393 A * | 8/2000 | Katagiri ................ B24B 53/017 451/444 |

(Continued)

FOREIGN PATENT DOCUMENTS

WO    WO-2015159973 A1 * 10/2015 ............. H01L 22/26

OTHER PUBLICATIONS

Takahashi English translation. 35 pp. Retrieved from internet on Jun. 4, 2019: https://patents.google.com/patent/US20170047237A1/en?oq=20170047237 (Year: 2019).*

(Continued)

*Primary Examiner* — David E Graybill
(74) *Attorney, Agent, or Firm* — BakerHostetler

(57) ABSTRACT

A dressing device including: a disk that has an opening on an inside, the disk dressing a polishing surface for polishing a substrate; a rotatable holder, the disk being coupled to a lower surface side of the holder, the holder being provided with a first flow passage that passes from a lower surface to an upper surface, the lower surface being inside an outer edge of the opening of the disk; and a housing that is provided with a distance from the upper surface of the holder, the housing being provided with a second flow passage in an interior, the housing being fixed such that an opening of the second flow passage faces the upper surface of the holder, the second flow passage being connected with a supply source and a suction source of process liquid.

15 Claims, 17 Drawing Sheets

(56) References Cited

U.S. PATENT DOCUMENTS

| | | | | |
|---|---|---|---|---|
| 6,508,697 B1* | 1/2003 | Benner | ................ | B24B 53/017 451/285 |
| 6,517,419 B1 | 2/2003 | Halley | | |
| 6,783,445 B2* | 8/2004 | Torii | ................ | B24B 37/04 451/287 |
| 7,040,967 B2* | 5/2006 | Benner | ................ | B24B 53/017 134/2 |
| 7,052,371 B2* | 5/2006 | Benner | ................ | B24B 53/00 257/E21.23 |
| 7,166,014 B2* | 1/2007 | Benner | ................ | B24B 37/042 438/690 |
| 7,217,172 B2* | 5/2007 | Benner | ................ | B24B 53/017 451/11 |
| 7,258,600 B1* | 8/2007 | Benner | ................ | B24B 53/00 257/E21.23 |
| 7,544,113 B1* | 6/2009 | Benner | ................ | B24B 53/00 451/21 |
| 7,575,503 B2* | 8/2009 | Benner | ................ | B24B 53/00 451/21 |
| 7,901,267 B1* | 3/2011 | Benner | ................ | B24B 53/00 451/21 |
| 8,025,555 B1* | 9/2011 | Benner | ................ | B24B 53/00 417/28 |
| 8,226,771 B2* | 7/2012 | Oikawa | ................ | B08B 3/02 134/1.3 |
| 8,517,796 B2* | 8/2013 | Shinozaki | ................ | B24B 49/08 451/443 |
| 8,655,478 B2* | 2/2014 | Fukuda | ................ | B24B 53/017 451/443 |
| 8,795,032 B2* | 8/2014 | Miyazaki | ................ | B24B 37/345 451/54 |
| D722,331 S* | 2/2015 | Shinozaki | ................ | D15/126 |
| D730,960 S* | 6/2015 | Shinozaki | ................ | D15/126 |
| D737,873 S* | 9/2015 | Shinozaki | ................ | D15/126 |
| D743,455 S* | 11/2015 | Shinozaki | ................ | D15/126 |
| D743,456 S* | 11/2015 | Shinozaki | ................ | D15/126 |
| D753,736 S* | 4/2016 | Shinozaki | ................ | D15/126 |
| 9,539,699 B2* | 1/2017 | Shinozaki | ................ | B24B 53/017 |
| 2002/0039880 A1* | 4/2002 | Torii | ................ | B24B 37/04 451/446 |
| 2003/0013381 A1* | 1/2003 | Benner | ................ | B24B 53/017 451/21 |
| 2004/0241989 A1* | 12/2004 | Benner | ................ | B24B 53/00 438/689 |
| 2005/0164606 A1* | 7/2005 | Benner | ................ | B24B 37/042 451/5 |
| 2005/0186891 A1* | 8/2005 | Benner | ................ | B24B 53/017 451/56 |
| 2007/0010172 A1* | 1/2007 | Benner | ................ | B24B 53/017 451/11 |
| 2007/0087672 A1* | 4/2007 | Benner | ................ | B24B 53/017 451/56 |
| 2007/0207705 A1* | 9/2007 | Benner | ................ | B24B 53/017 451/11 |
| 2007/0281592 A1* | 12/2007 | Benner | ................ | B24B 53/00 451/72 |
| 2008/0160883 A1* | 7/2008 | Benner | ................ | B24B 55/06 451/73 |
| 2009/0301518 A1* | 12/2009 | Oikawa | ................ | B08B 3/02 134/1.3 |
| 2009/0305612 A1* | 12/2009 | Miyazaki | ................ | B24B 37/345 451/11 |
| 2010/0081361 A1* | 4/2010 | Fukuda | ................ | B24B 53/017 451/5 |
| 2010/0311309 A1* | 12/2010 | Shinozaki | ................ | B24B 49/08 451/5 |
| 2011/0177623 A1* | 7/2011 | Benner | ................ | B24B 37/042 438/5 |
| 2012/0115403 A1* | 5/2012 | Lu | ................ | B24B 53/017 451/443 |
| 2014/0179204 A1* | 6/2014 | Shinozaki | ................ | B24B 53/017 451/443 |
| 2014/0357164 A1 | 12/2014 | Nabeya et al. | | |
| 2015/0065019 A1* | 3/2015 | Shinozaki | ................ | B24B 53/017 451/443 |
| 2015/0314418 A1* | 11/2015 | Shinozaki | ................ | B24B 55/06 156/345.12 |
| 2016/0074994 A1* | 3/2016 | Shinozaki | ................ | B24B 53/017 451/59 |
| 2017/0047237 A1* | 2/2017 | Kobata | ................ | H01L 21/6838 |
| 2018/0047572 A1* | 2/2018 | Shinozaki | ................ | B24B 37/04 |

OTHER PUBLICATIONS

Singapore Patent Application No. 10201706464Y; Search Report and Written Opinion; dated Nov. 7, 2019; 10 pages.

* cited by examiner

DRESSING DEVICE, POLISHING APPARATUS, HOLDER, HOUSING AND DRESSING METHOD

CROSS-REFERENCE TO RELATED APPLICATIONS

This application claims the benefit of Japanese Priority Patent Application JP 2016-158456 filed on Aug. 12, 2016, the entire contents of which are incorporated herein by reference.

FIELD

This technique is related to a dressing device, a polishing apparatus, a holder, a housing and a dressing method.

BACKGROUND AND SUMMARY

As semiconductor miniaturization advances, the vertical structure has been complicated, in addition to the reduction in the horizontal dimensions. Therefore, there is an increased need for techniques of flattening the surface of a semiconductor substrate (wafer) and facilitating the processing. Among such flattening techniques, particularly, a chemical mechanical polishing (CMP) technique has become more important.

A polishing apparatus using the CMP technique polishes a semiconductor substrate held by a polishing head, by sliding a polishing pad, while dropping polishing liquid. When the polishing of the substrate is performed, the polishing performance gradually deteriorates, due to abrasive grains and polishing chips adhering to the surface of the polishing pad or due to the change in the property of the polishing pad. Hence, in the CMP, generally, a process called a dressing (conditioning), in which adhering substances on the surface of the polishing pad are removed, the dressing is performed and the surface state is recovered, is performed, during polishing or after polishing.

For example, U.S. Pat. No. 6,508,697 discloses a polishing system including a dresser that includes a supply port for supplying process liquid to a hollow rotation shaft of the dresser and a fixed cover that includes a suction port for sucking the process liquid to the outer circumference side of the dresser. Further, the rotation shaft of the dresser passes through a hole provided on the cover.

However, the hollow structure of the rotation shaft of the dresser as shown in U.S. Pat. No. 6,508,697 has the following practical problem. A contact seal between the hole provided on the cover and the rotation shaft of the dresser deteriorates due to polishing liquid (also referred to as slurry), and therefore, the maintenance frequency increases. For practical use, it is necessary to dispose a rotary joint on the rotation shaft, in order to avoid a hose inserted into the suction port from tangling due to the rotation. Therefore, it is not possible to dispose a cylinder that generates a pressing force on the rotation shaft. Accordingly, a load acting axis is offset horizontally from the rotation shaft, a moment acts on the rotation shaft, and a sliding resistance force increases. Therefore, it is not possible to smoothly control the pressing force.

Further, in the case where the suction port for sucking the process liquid is provided on the outer circumference side of the dresser as shown in U.S. Pat. No. 6,508,697, there is a problem in that it is not possible to sufficiently remove the polishing liquid and debris stuck near the center of the dresser.

It is desired to provide a dressing device, a polishing apparatus, a holder, a housing and a dressing method that make it possible to reduce the maintenance frequency and to smoothly control the pressing force, and that make it possible to enhance the ability of the removal of the polishing liquid and debris stuck near the center.

A dressing device according to one aspect of this technique, a dressing device comprising: a disk that has an opening on an inside, the disk dressing a polishing surface for polishing a substrate; a rotatable holder, the disk being coupled to a lower surface side of the holder, the holder being provided with a first flow passage that passes from a lower surface to an upper surface, the lower surface being inside an outer edge of the opening of the disk; and a housing that is provided with a distance from the upper surface of the holder, the housing being provided with a second flow passage in an interior, the housing being fixed such that an opening of the second flow passage faces the upper surface of the holder, the second flow passage being connected with a supply source and a suction source of process liquid, wherein the process liquid is supplied from the supply source to the polishing surface, through the second flow passage and the first flow passage in order, and the process liquid on the polishing surface is sucked by the suction source, through the first flow passage and the second flow passage in order.

A holder according to one aspect of this technique, a holder that is a component to be used together with a housing fixed in a dressing device, wherein the holder is rotatable, a disk is capable of being coupled to a lower surface side of the holder, and the holder is provided with a flow passage that passes from a lower surface to an upper surface, the lower surface being inside an outer edge of the opening of the disk when the disk is coupled.

A housing according to one aspect of this technique, a housing that is a component to be used together with a holder that is rotatable in a dressing device, wherein the housing is provided with a distance from an upper surface of the holder, the housing is provided with a second flow passage in an interior, the housing is fixed such that one end of the second flow passage faces the upper surface of the holder, and the second flow passage is connected with a supply source and a suction source of process liquid.

A dressing method according to one aspect of this technique, a dressing method that is executed by a dressing device, the dressing device comprising: a disk that has an opening on an inside, the disk dressing a polishing surface for polishing a substrate; a rotatable holder, the disk being coupled to a lower surface side of the holder, the holder being provided with a first flow passage that passes from a lower surface to an upper surface, the lower surface being inside an outer edge of the opening of the disk; and a housing that is provided with a distance from the upper surface of the holder, the housing being provided with a second flow passage in an interior, the housing being fixed such that one end of the second flow passage faces the upper surface of the holder, the dressing method comprising: a step of supplying pure water to the polishing surface, through the second flow passage and the first flow passage in order, during dressing; and a step of sucking process liquid on the polishing surface, through the first flow passage and the second flow passage in order, during the dressing.

DETAILED DESCRIPTION OF NON-LIMITING EXAMPLE EMBODIMENTS

Figure 1:
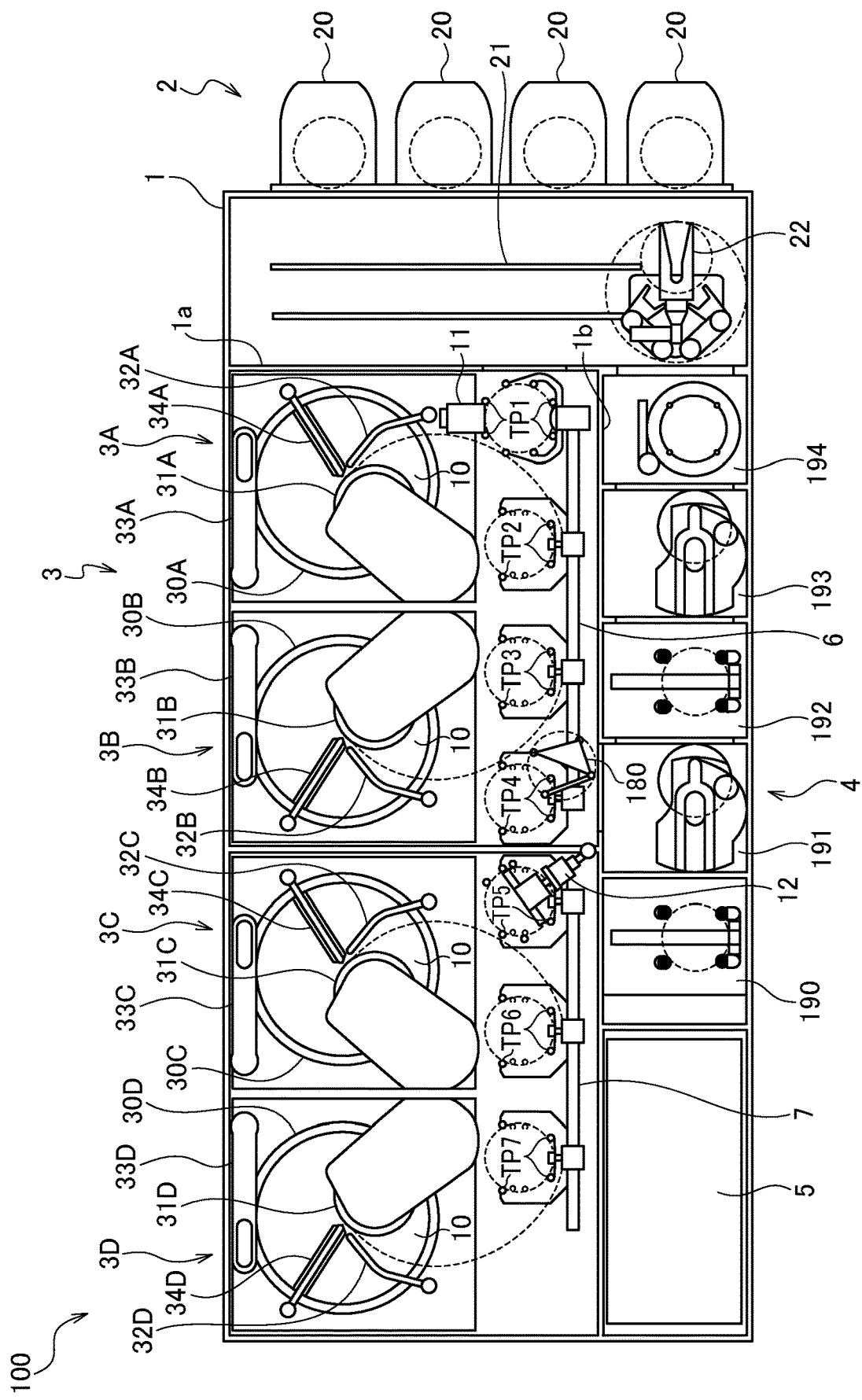
FIG. 1 is a plan view showing the whole configuration of the polishing apparatus 100 according to the embodiment of the technique.

Hereinafter, an embodiment according to the technique will be described with reference to the drawings. A polishing apparatus 100 according to the embodiment polishes a polished surface of a polishing object by the relative slide between the polished surface and a polishing member. The polishing object according to the embodiment is a substrate, and the description will be made taking a wafer as an example of the substrate. Further, in the embodiment, the polishing member will be described taking a polishing pad as an example.

A dressing device according to a 1st aspect of this technique, a dressing device comprising: a disk that has an opening on an inside, the disk dressing a polishing surface for polishing a substrate; a rotatable holder, the disk being coupled to a lower surface side of the holder, the holder being provided with a first flow passage that passes from a lower surface to an upper surface, the lower surface being inside an outer edge of the opening of the disk; and a housing that is provided with a distance from the upper surface of the holder, the housing being provided with a second flow passage in an interior, the housing being fixed such that an opening of the second flow passage faces the upper surface of the holder, the second flow passage being connected with a supply source and a suction source of process liquid, wherein the process liquid is supplied from the supply source to the polishing surface, through the second flow passage and the first flow passage in order, and the process liquid on the polishing surface is sucked by the suction source, through the first flow passage and the second flow passage in order.

According to this configuration, since the contact seal is not provided between the first flow passage and second flow passage through which the polishing liquid passes, the deterioration of the contact seal does not occur, and the maintenance frequency can be reduced. Pipes (for example, hoses) to be connected with the supply source and the suction source are connected with the fixed housing, and therefore, it is not necessary to dispose a rotary joint on the rotation shaft for the holder. Accordingly, it is possible to dispose a member that generates a pressing force on the rotation shaft for the holder, and therefore, it is possible to smoothly control the pressing force. Furthermore, the inside of the outer edge of the opening of the disk tends to have a negative pressure due to the suction by the suction source, and a pressing force by which the disk surface follows the polishing surface is generated. Therefore, it is possible to expect the enhancement of the dressing efficiency. Further, it is possible to perform the suction from the inside of the outer edge of the opening of the disk, and therefore, it is possible to enhance the efficiency of the removal of the polishing liquid and debris stuck near the center. Further, even if the process liquid overflows from between the holder and the housing, it is possible to supply the process liquid to the circumference of the dresser, along the holder (specifically, along an upper surface inclined portion), and therefore, it is possible to uniformly supply the process liquid to the pad surface, compared to the conventional supply method. Furthermore, as the supply of the process liquid for dressing, it is possible to perform both the supply of the process liquid from the interior of the dresser through the holder and the supply of the process liquid to the circumference of the dresser by the overflow of the process liquid from between the holder and the housing, and it is possible to uniformly supply the process liquid in a wide range and in the vicinity of the dressing process surface.

A dressing device according to a 2nd aspect of this technique, the dressing device according to the 1st aspect, wherein the housing includes a projecting portion that forms the opening of the second flow passage and that projects downward, and a groove is formed on an upper surface side of the holder, the groove forming a part of the first flow passage and surrounding at least a part of a periphery of the projecting portion.

According to this configuration, between the downward projecting portion of the housing and the groove of the holder, a labyrinth structure with a downward convex shape and a concave shape is formed, and a non-contact seal is configured. Thereby, as long as the flow rate is regulated such that a pressure exceeding a pressure corresponding to the depth of the groove is not generated in the downward flow passage in the holder, it is possible to supply the process liquid without the overflow from the groove. Further, since the seal is not provided between the first flow passage and second flow passage through which the polishing liquid passes, the deterioration of the seal does not occur, and the maintenance frequency can be reduced.

A dressing device according to a 3rd aspect of this technique, the dressing device according to the 1st aspect, further comprising a switching unit that switches a communication point of the second flow passage of the housing between the supply source and the suction source.

According to this configuration, when the communication point is switched to the supply source, even for the debris that is difficult to remove, it is possible to float the debris from the polishing surface by injecting a high-pressure process liquid (for example, a chemical). Thereafter, when the communication point is switched to the suction source without moving the position of a dressing head including the disk, it is possible to suck and discharge the floated debris together with the process liquid.

A dressing device according to a 4th aspect of this technique, the dressing device according to the 3rd aspect, further comprising a control unit that controls the switching unit such that the second flow passage of the housing communicates with either the supply source or the suction source.

According to this configuration, it is possible to automatically switch the communication point of the flow passage of the housing, and therefore, it is possible to enhance the dressing efficiency.

A dressing device according to a 5th aspect of this technique, the dressing device according to the 1st aspect, wherein a chamber is provided on the second flow passage of the housing, the chamber being capable of temporarily storing the process liquid.

According to this configuration, it is possible to continuously supply the process liquid stored in the chamber, to the polishing surface. Further, it is possible to continuously discharge the process liquid stored in the chamber, to the exterior.

A dressing device according to a 6th aspect of this technique, the dressing device according to the 5th aspect, wherein a plurality of holes are formed on the housing, the plurality of holes communicating with the chamber, being formed on a lower surface side of the housing and being arranged substantially radially at intervals from each other, and a plurality of the second flow passages are provided, each of the plurality of the second flow passages being formed by one of the holes and the chamber.

According to this configuration, it is possible to uniformly drop the process liquid from the plurality of holes to the upper surface of the holder, and it is possible to uniformly supply the process liquid to a region on the inside of the disk.

A dressing device according to a 7th aspect of this technique, the dressing device according to the 5th aspect, wherein the chamber surrounds a rotation shaft for the holder, and has a substantially annular shape.

According to this configuration, it is possible to temporarily store the process liquid around the rotation shaft for the holder, and to supply the process liquid to the polishing surface more uniformly.

A dressing device according to an 8th aspect of this technique, the dressing device according to the second aspect, wherein a plurality of holes are formed on the holder, the plurality of holes being arranged substantially radially at intervals from each other, the groove communicates with the plurality of holes and has an annular shape, a plurality of the first flow passages are provided, each of the plurality of the first flow passages being formed by one of the holes and the groove, and a distance between an end of the projecting portion and a bottom of the groove is longer than a distance between a portion of a lower surface of the housing and the upper surface of the holder, the portion of the lower surface of the housing being a portion where the projecting portion is not provided.

According to this configuration, it is possible to avoid the process liquid from flowing out of the groove, by keeping the process liquid in the groove as much as possible.

A dressing device according to a 9th aspect of this technique, the dressing device according to the 1st aspect, wherein the first flow passage is inclined so as to be closer to a rotation shaft of the holder as it goes to the lower surface side.

According to this configuration, it is possible to smoothly supply the process liquid in the direction of the rotation shaft.

A dressing device according to a 10th aspect of this technique, the dressing device according to the 1st aspect, wherein a straightening plate is provided on the lower surface side of the holder, the straightening plate being provided with a plurality of holes and covering the opening of the first flow passage.

According to this configuration, when the process liquid is supplied to the polishing surface, the process liquid, after passing through the first flow passage, is supplied to the polishing surface through the straightening plate. Thereby, the process liquid dropped from the first flow passage drops from the plurality of holes formed on the straightening plate, so that the process liquid is supplied to the polishing surface more uniformly. Further, when the process liquid is sucked from the polishing surface, the process liquid, after passing through the straightening plate, is sucked through the first flow passage. Thereby, it is possible to constantly suck the process liquid on the polishing surface evenly in the circumferential direction, and it is possible to suck the process liquid from the polishing surface more uniformly.

A dressing device according to an 11th aspect of this technique, the dressing device according to the 1st aspect, further comprising a rotatable rotation shaft, wherein the holder is coupled to the rotation shaft in a detachable manner.

According to this configuration, the holder can be detached from the dressing device, and therefore, even if the polishing liquid sticks to the first flow passage in the holder, the polishing liquid can be easily removed. Therefore, the maintenance property for the removal of the polishing liquid is enhanced.

A dressing device according to a 12th aspect of this technique, the dressing device according to the 1st aspect, further comprising a turnable arm, wherein the housing is coupled to the arm in a detachable manner.

According to this configuration, the housing can be detached from the dressing device, and therefore, even if the polishing liquid sticks to the second flow passage in the housing, the polishing liquid can be easily removed. Therefore, the maintenance property for the removal of the polishing liquid is enhanced.

A polishing apparatus according to a 13th aspect of this technique, a polishing apparatus comprising the dressing device according to any one of aspects 1 to 12.

According to this configuration, in the polishing apparatus, it is possible to reduce the maintenance frequency, and to smoothly control the pressing force, and it is possible to enhance the ability of the removal of the polishing liquid and debris stuck near the center.

A holder according to a 14th aspect of this technique, a holder that is a component to be used together with a housing fixed in a dressing device, the holder comprising: a connect portion that connects with a disk, the connect portion being located on a lower surface side of the holder, wherein a flow passage that passes from the lower surface to an upper surface is provided in the holder, one end of the flow passage on the lower surface is located inside an outer edge of the opening of the disk when the disk is connected with the holder.

A housing according to a 15th aspect of this technique, a housing that is a component to be used together with a holder that is rotatable in a dressing device, wherein the housing is provided with a distance from an upper surface of the holder, the housing is provided with a second flow passage in an interior, the housing is fixed such that one end of the second flow passage faces the upper surface of the holder, and the second flow passage is connected with a supply source and a suction source of process liquid.

A dressing method according to a 16th aspect of this technique, a dressing method that is executed by a dressing device, the dressing device comprising: a disk that has an opening on an inside, the disk dressing a polishing surface for polishing a substrate; a rotatable holder, the disk being coupled to a lower surface side of the holder, the holder being provided with a first flow passage that passes from a lower surface to an upper surface, the lower surface being inside an outer edge of the opening of the disk; and a housing that is provided with a distance from the upper surface of the holder, the housing being provided with a second flow passage in an interior, the housing being fixed such that one end of the second flow passage faces the upper surface of the holder, the dressing method comprising: a first supplying pure water to the polishing surface, through the second flow passage and the first flow passage in order, during dressing; and a first sucking process liquid on the polishing surface, through the first flow passage and the second flow passage in order, during the dressing.

According to this configuration, it is possible to supply the process liquid during the dressing, and therefore, it is possible to perform the stable supply of the water quantity to a dressing process point. Therefore, it is possible to expect the enhancement of the dressing effect, and it is possible to contribute to the enhancement of the productivity. Further, since the process liquid is sucked during the dressing, it is possible to remove the debris on the polishing surface. It is possible to efficiently perform the conditioning of the polishing surface, to reduce the residue of scratch sauce, and to contribute to the enhancement of the productivity.

A dressing method according to a 17th aspect of this technique, the dressing method according to the 16th aspect, further comprising: a second supplying polishing liquid to the polishing surface, through the second flow passage and the first flow passage in order, during polishing by a polishing head; and a second sucking the process liquid on the polishing surface, through the first flow passage and the second flow passage in order, during supply of washing water by an atomizer.

According to this configuration, it is possible to supply the polishing liquid while performing a light dressing. Further, during the supply of the washing water by the atomizer, it is possible to suck the process liquid containing dressing dregs and/or polishing dregs, from the polishing surface, and discharge the process liquid.

FIG. 1 is a plan view showing the whole configuration of the polishing apparatus 100 according to the embodiment of the technique. As shown in FIG. 1, the polishing apparatus 100 includes a housing 1 having a substantially rectangular shape, and the interior of the housing 1 is sectioned into a loading/unloading unit 2, a polishing unit 3 and a washing unit 4, by partition walls 1a, 1b. The loading/unloading unit 2, the polishing unit 3 and the washing unit 4 are assembled independently of each other, and are vented independently of each other. The washing unit 4 is sectioned into a first washing chamber 190, a first transport chamber 191, a second washing chamber 192, a second transport chamber 193 and a drying chamber 194. Further, the polishing apparatus 100 includes a control unit 5 that controls a substrate processing operation.

The loading/unloading unit 2 includes two or more (four in the embodiment) front loading units 20 in each of which a wafer cassette to stock many wafers (substrates) is placed. The front loading units 20 are arranged so as to be adjacent to the housing 1, and are arrayed along the width direction (the direction perpendicular to the longitudinal direction) of the polishing apparatus 100. The front loading unit 20 allows the mounting of an open cassette, a SMIF (Standard Manufacturing Interface) pod or a FOUP (Front Opening Unified Pod). Here, each of the SMIF and the FOUP is a closed container that contains a wafer cassette in the interior and that can keep an environment independent of the external space by the covering with a partition wall.

Further, in the loading/unloading unit 2, a travelling mechanism 21 is laid along the array of the front loading units 20, and a transport robot (loader) 22 that can move along the direction of the array of the wafer cassettes is disposed on the travelling mechanism 21. The transport robot 22 moves on the travelling mechanism 21, and thereby, can access the wafer cassette mounted on the front loading unit 20. The transport robot 22 includes two hands that are vertically arranged. The upper and lower hands are used for different purposes such that the upper hand is used when a wafer after processing is returned to the wafer cassette and the lower hand is used when a wafer before processing is taken from the wafer cassette. Furthermore, the lower hand of the transport robot 22 is configured to be capable of reversing the wafer by rotating around the shaft center.

The loading/unloading unit 2 is a region that requires keeping the cleanest state, and therefore, the interior of the loading/unloading unit 2 is constantly maintained at a higher pressure than all of the exterior of the polishing apparatus 100, the polishing unit 3 and the washing unit 4. The polishing unit 3 is the dirtiest region because slurry is used as the polishing liquid. Therefore, in the interior of the polishing unit 3, a negative pressure is applied, and the pressure is maintained at a lower pressure than the inner pressure of the washing unit 4. The loading/unloading unit 2 is provided with a filter fan unit (not illustrated) including a clean air filter such as a HEPA filter, a ULPA filter or a chemical filter. The filter fan unit constantly jets out clean air in which particles, toxic vapor and toxic gas are removed.

The polishing unit 3 is a region where the polishing (flattening) of a wafer is performed, and includes a first polishing unit 3A, a second polishing unit 3B, a third polishing unit 3C and a fourth polishing unit 3D. As shown in FIG. 1, the first polishing unit 3A, the second polishing unit 3B, the third polishing unit 3C and the fourth polishing unit 3D are arrayed along the longitudinal direction of the polishing apparatus 100.

As shown in FIG. 1, the first polishing unit 3A includes a table 30A to which a polishing pad 10 having a polishing surface is attached, a top ring (polishing head) 31A for holding the wafer and polishing the wafer while pressing the wafer to the polishing pad 10 on the table 30A, a polishing liquid supply nozzle (polishing liquid supply unit) 32A for supplying polishing liquid or dressing liquid (for example, pure water) to the polishing pad 10, a dresser 33A for dressing the polishing surface of the polishing pad 10, and an atomizer 34A for injecting a fluid to the polishing surface and sucking the fluid on the polishing surface. For example, the fluid is a gas (for example, nitrogen gas), a fluid mixture of a liquid (for example, pure water) and a gas (for example, nitrogen gas), or a liquid (for example, pure water). The fluid may be a misty fluid.

Similarly, the second polishing unit 3B includes a table 30B to which the polishing pad 10 is attached, a top ring (polishing head) 31B, a polishing liquid supply nozzle 32B, a dresser 33B, and an atomizer 34B. The third polishing unit 3C includes a table 30C to which the polishing pad 10 is attached, a top ring (polishing head) 31C, a polishing liquid supply nozzle 32C, a dresser 33C, and an atomizer 34C. The fourth polishing unit 3D includes a table 30D to which the polishing pad 10 is attached, a top ring (polishing head) 31D, a polishing liquid supply nozzle 32D, a dresser 33D, and an atomizer 34D.

The atomizers 34A, 34B, 34C, 34D are nozzles that inject a high-pressure washing water, and inject the high-pressure washing water to the polishing pad surface, after the polishing or at the time of water polishing in an end phase of the polishing.

Next, a transport mechanism for transporting the wafer will be described. As shown in FIG. 1, a first linear transporter 6 is arranged so as to be adjacent to the first polishing unit 3A and the second polishing unit 3B. The first linear transporter 6 is a mechanism that transports the wafer among four transport positions along a direction in which the first polishing unit 3A and the second polishing unit 3B are arrayed (the order of a first transport position TP1, a second transport position TP2, a third transport position TP3 and a fourth transport position TP4 from the loading/unloading unit side).

Further, a second linear transporter 7 is arranged so as to be adjacent to the third polishing unit 3C and the fourth polishing unit 3D. The second linear transporter 7 is a mechanism that transports the wafer among three transport positions along a direction in which the third polishing unit 3C and the fourth polishing unit 3D are arrayed (the order of a fifth transport position TP5, a sixth transport position TP6 and a seventh transport position TP7 from the loading/unloading unit side).

By the first linear transporter 6, the wafer is transported to the first polishing unit 3A and the second polishing unit 3B. As described above, the top ring 31A of the first polishing unit 3A is moved between the polishing position and the second transport position TP2 by the swing action of a top ring head (not illustrated). Therefore, the transfer of the wafer to the top ring 31A is performed at the second transport position TP2. Similarly, the top ring 31B of the second polishing unit 3B is moved between the polishing position and the third transport position TP3, and the transfer of the wafer to the top ring 31B is performed at the third transport position TP3. The top ring 31C of the third polishing unit 3C is moved between the polishing position and the sixth transport position TP6, and the transfer of the wafer to the top ring 31C is performed at the sixth transport position TP6. The top ring 31D of the fourth polishing unit 3D is moved between the polishing position and the seventh transport position TP7, and the transfer of the wafer to the top ring 31D is performed at the seventh transport position TP7.

At the first transport position TP1, a lifter 11 for receiving the wafer from the transport robot 22 is arranged. The wafer is transferred from the transport robot 22 to the first linear transporter 6 through the lifter 11. Between the lifter 11 and the transport robot 22, a shutter (not illustrated) is provided on the partition wall 1a. At the time of the transport of the wafer, the shutter is opened, and the wafer is transferred from the transport robot 22 to the lifter 11. Further, a swing transporter 12 is arranged among the first linear transporter 6, the second linear transporter 7 and the washing unit 4. The swing transporter 12 includes a hand that can move between the fourth transport position TP4 and the fifth transport position TP5, and the transfer of the wafer from the first linear transporter 6 to the second linear transporter 7 is performed by the swing transporter 12. By the second linear transporter 7, the wafer is transported to the third polishing unit 3C and/or the fourth polishing unit 3D. Further, a temporary placement table 180 for the wafer that is disposed in an unillustrated frame is arranged on a lateral side of the swing transporter 12. As shown in FIG. 1, the temporary placement table 180 is arranged so as to be adjacent to the first linear transporter 6, and is positioned between the first linear transporter 6 and the washing unit 4. The wafer polished in the polishing unit 3 is placed on the temporary placement table 180 through the swing transporter 12, and thereafter, the wafer is transported to the washing unit 4 by the transport robot of the washing unit 4.

The dressers 33A, 33B, 33C, 33D have the same configuration as each other. Hereinafter, the dressers 33A, 33B, 33C, 33D are collectively referred to as a dresser 33. In the following, a dressing device included in the polishing apparatus 100 will be described.

Figure 2:
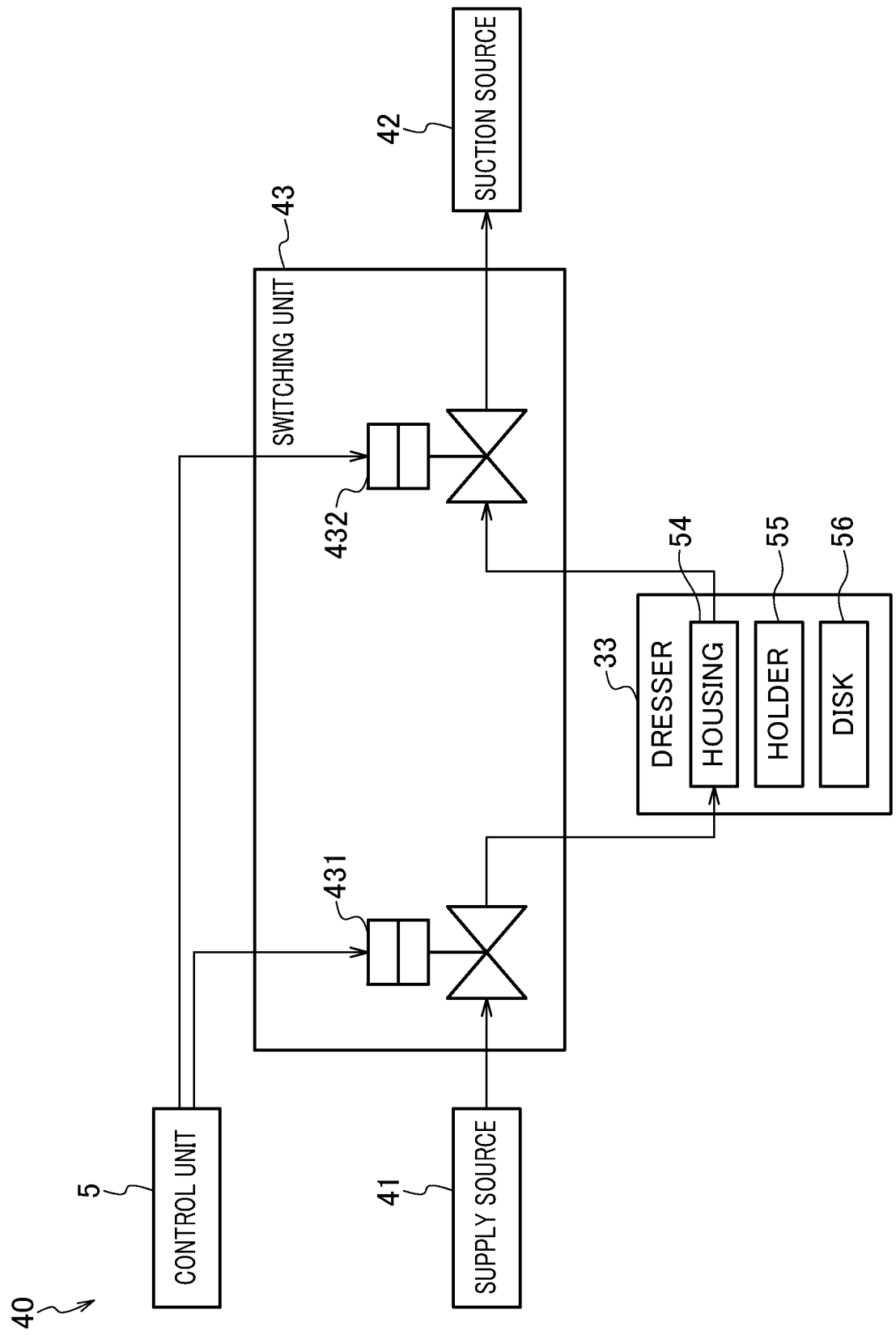
FIG. 2 is a configuration diagram showing the outline of the dressing device according to the embodiment.

FIG. 2 is a configuration diagram showing the outline of the dressing device according to the embodiment. As shown in FIG. 2, a dressing device 40 according to the embodiment includes the dresser 33, a supply source 41, a suction source 42, a switching unit 43, and the control unit 5.

The dresser 33 includes a housing 54 that is fixed, a rotatable holder 55, and a disk 56 that is coupled to the lower surface side of the holder.

The supply source 41 is a supply source of a process liquid. Examples of the process liquid include pure water (DIW), washing liquid and/or slurry.

The suction source 42 is a suction source of the process liquid. Examples of the suction source 42 include a vacuum pump, an ejector, an accumulator and a cyclone steam-water separation device.

The switching unit 43 switches the communication point of the flow passage of the housing 54 between the supply source 41 and the suction source 42. Thereby, when the communication point is switched to the supply source 41, even for the debris that is difficult to remove, it is possible to float the debris from the polishing surface by injecting a high-pressure process liquid (for example, a chemical). Thereafter, when the communication point is switched to the suction source 42 without moving the position of a dressing head including the disk, it is possible to suck and discharge the floated debris together with the process liquid. In the embodiment, as an example, the switching unit 43 includes a first valve 431 and a second valve 432 as shown in FIG. 2.

The control unit 5 controls the switching unit 43 such that the flow passage of the housing 54 communicates with either the supply source 41 or the suction source 42. Thereby, it is possible to automatically switch the communication point of the flow passage of the housing 54, and therefore, it is possible to enhance the dressing efficiency. For example, when the process liquid is supplied to the polishing surface, the control unit 5 controls the switching unit 43 such that the first valve 431 is opened and the second valve 432 is closed. On the other hand, for example, when the process liquid on the polishing surface is sucked, the control unit 5 controls the switching unit 43 such that the first valve 431 is closed and the second valve 432 is opened.

Figure 3:
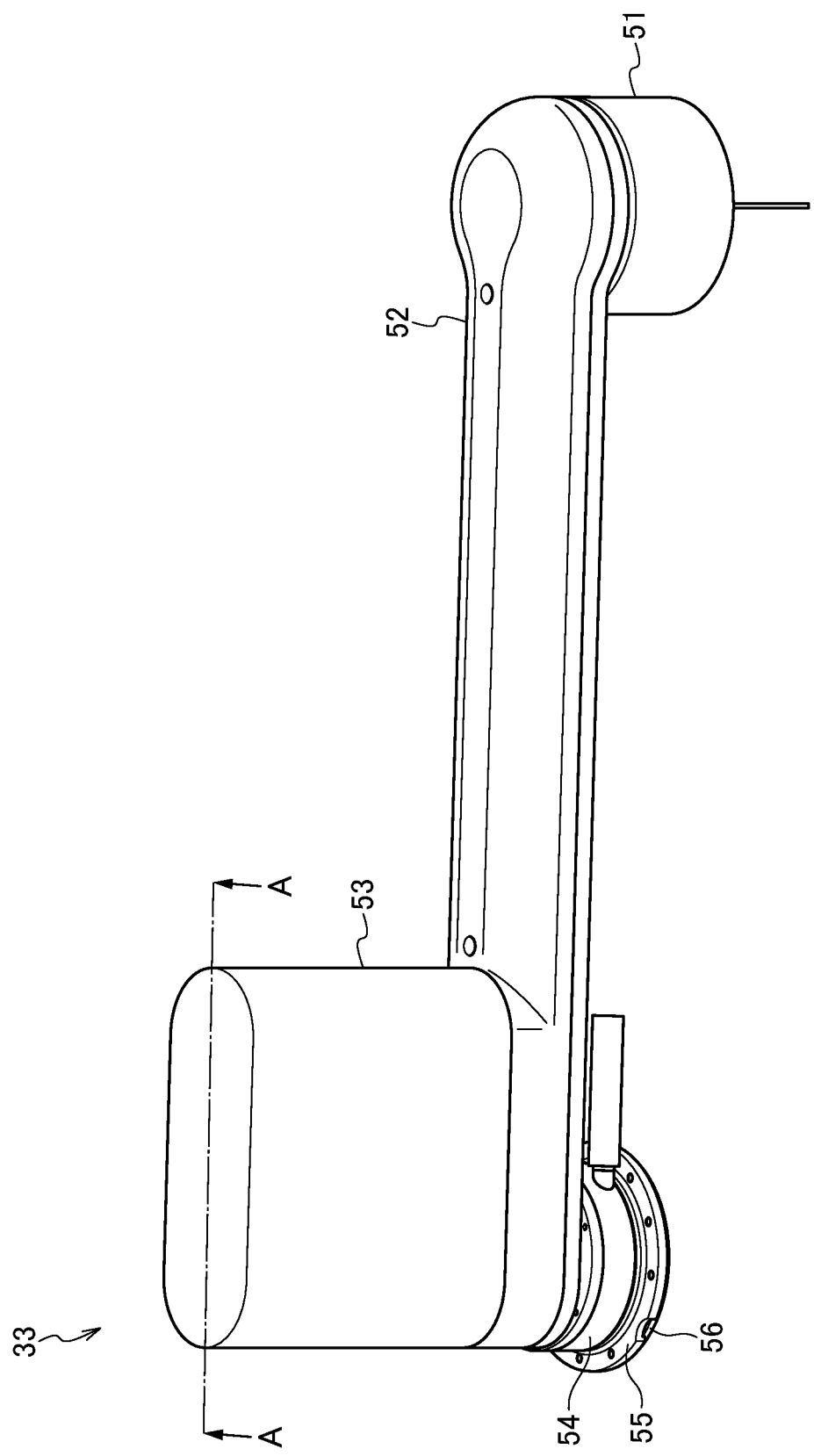
FIG. 3 is a perspective view showing the outline of the dresser 33.

Subsequently, the structure of the dresser will be described with use of FIG. 3 to FIG. 15. FIG. 3 is a perspective view showing the outline of the dresser 33. As shown in FIG. 3, the dresser 33 includes a support shaft 51, an arm 52 that is coupled on the support shaft 51 and that is capable of turning substantially horizontally, and a head 53 that is coupled on the arm 52. Further, the dresser 33 includes the housing 54 that is coupled to the arm 52, the holder 55 that faces the housing 54 at an interval, and the disk 56 that is coupled to the lower surface of the holder 55.

Figure 4:
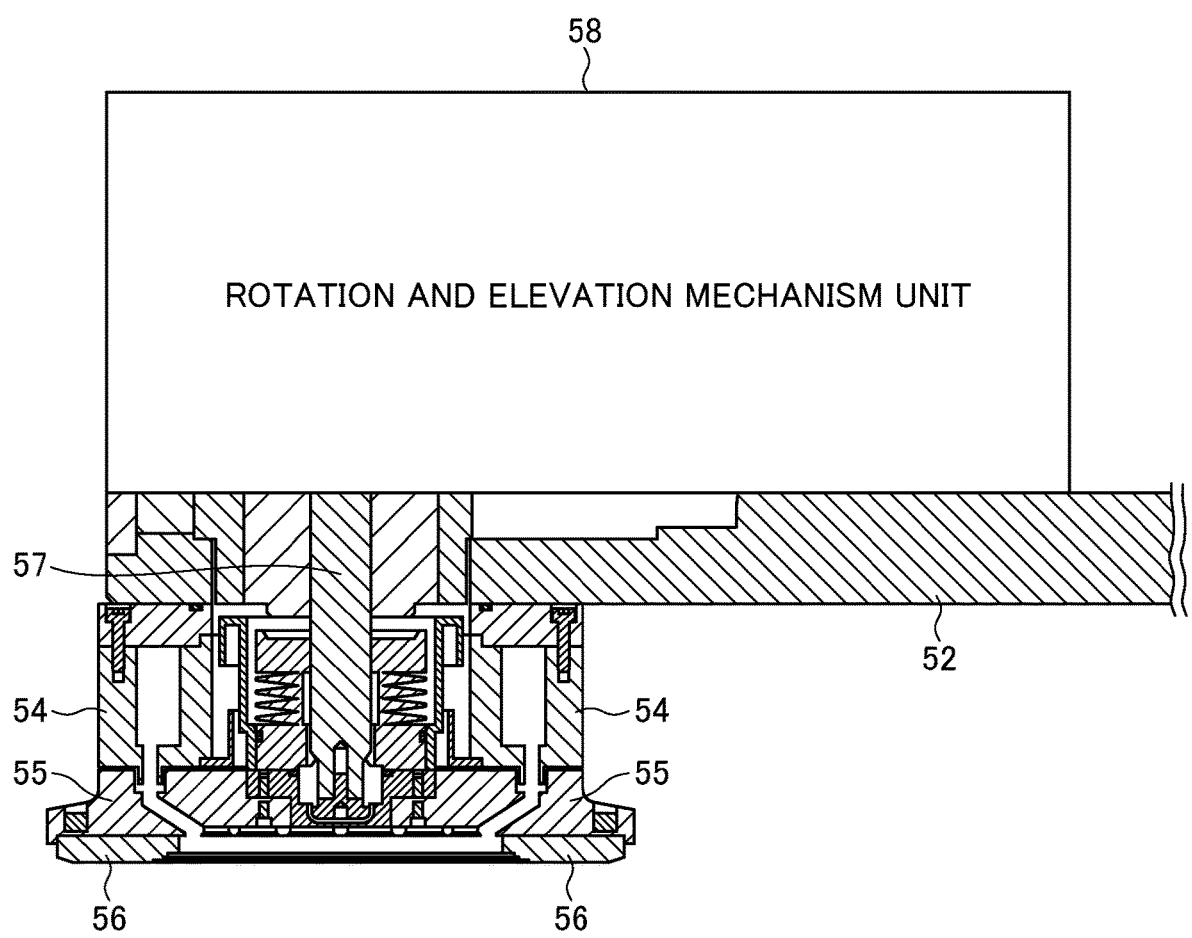
FIG. 4 is a schematic diagram of an A-A cross-section in FIG. 3.

FIG. 4 is a schematic diagram of an A-A cross-section in FIG. 3. The dresser 33 further includes a rotatable rotation shaft 57. In U.S. Pat. No. 6,508,697, the polishing liquid sticks to the rotation shaft for the dresser, but there is a problem in that the maintenance for the removal is difficult. On the other hand, the holder 55 according to the embodiment is coupled to the rotation shaft 57 in a detachable manner, and rotates together with the rotation shaft 57, as shown in FIG. 4. Thereby, the holder 55 can be detached from the dressing device 40, and therefore, even if the polishing liquid sticks to the later-described first flow passage in the holder 55, the polishing liquid can be easily removed. Therefore, the maintenance property for the removal of the polishing liquid is enhanced.

Further, as shown in FIG. 4, the housing 54 according the embodiment is fixed by being coupled to the arm 52 in a detachable manner, and therefore, does not rotate even if the holder 55 rotates. Thereby, the housing 54 can be detached from the dressing device 40, and therefore, even if the polishing liquid sticks to the later-described second flow passage in the housing 54, the polishing liquid can be easily removed. Therefore, the maintenance property for the removal of the polishing liquid is enhanced. The disk 56 has an opening on the inside, and sets the polishing surface for polishing the wafer W. As shown in FIG. 4, the disk 56 according to the embodiment has an annular shape, as an example.

The rotation shaft 57 is coupled to a rotation and elevation mechanism unit 58 that includes an unillustrated cylinder. The rotation and elevation mechanism unit 58 rotates and elevates the rotation shaft 57. Thereby, the cylinder of the rotation and elevation mechanism unit 58 can weight the rotation shaft 57 downward along the long axis of the rotation shaft 57. Thereby, the load acting axis coincides with the rotation shaft 57, and therefore, it is possible to smoothly press the disk 56 onto the polishing surface.

Figure 5:
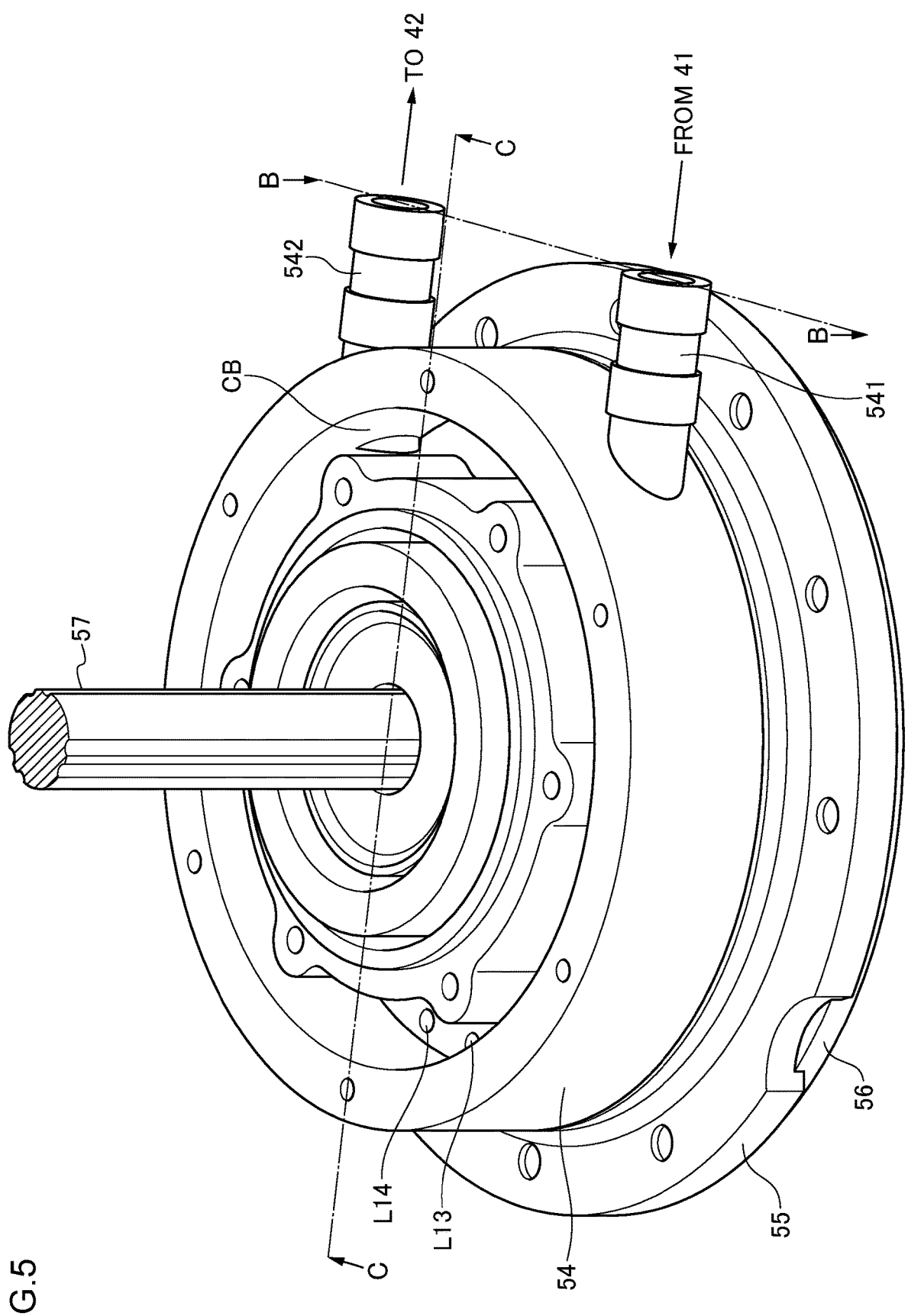
FIG. 5 is a perspective view of a portion of the dresser 33.

FIG. 5 is a perspective view of a portion of the dresser 33. As shown in FIG. 5, the housing 54 includes a supply port 541 that is connected with the supply source 41 through the first valve 431, and a discharge port 542 that is connected with the suction source 42 through the second valve 432. Further, in the interior of the housing 54, a chamber CB that communicates with the supply port 541 and the discharge port 542 is provided. Thereby, the process liquid flows into the chamber CB through the supply port 541. The process liquid is discharged from the chamber CB through the discharge port 542.

Figure 6:
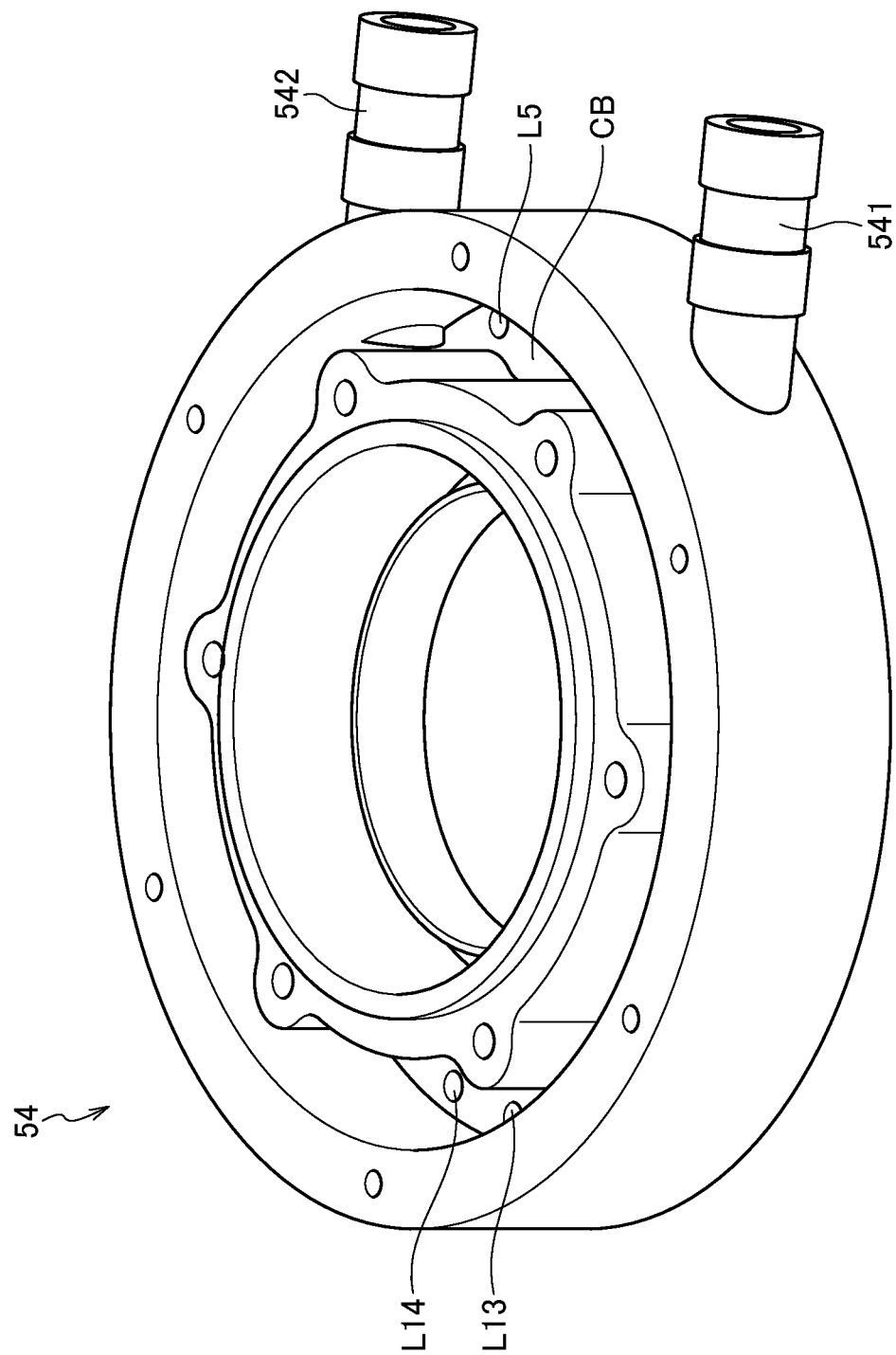
FIG. 6 is a perspective view of the housing 54 as viewed from the upper side.
Figure 7:
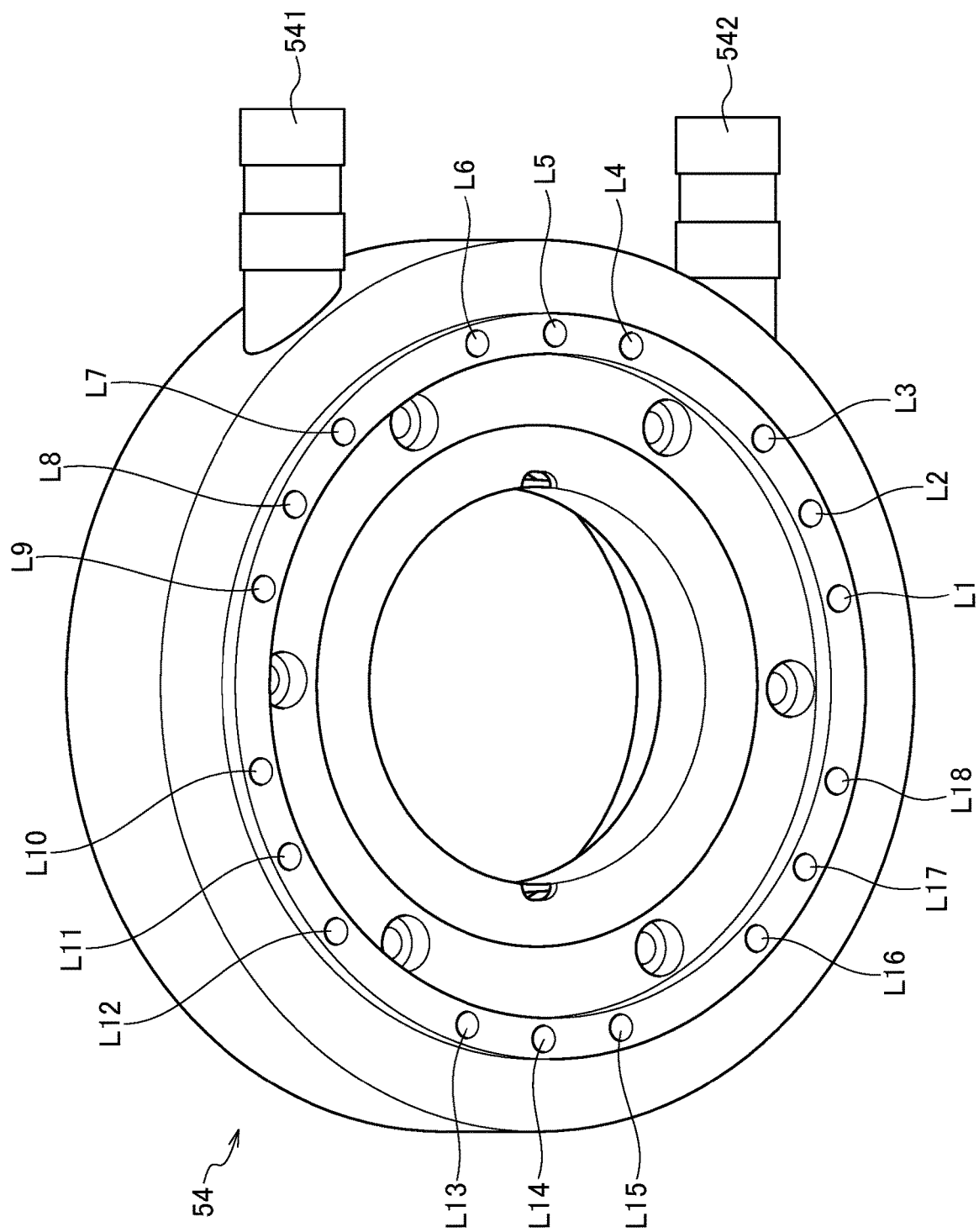
FIG. 7 is a perspective view of the housing 54 as viewed from the back side.
Figure 8:
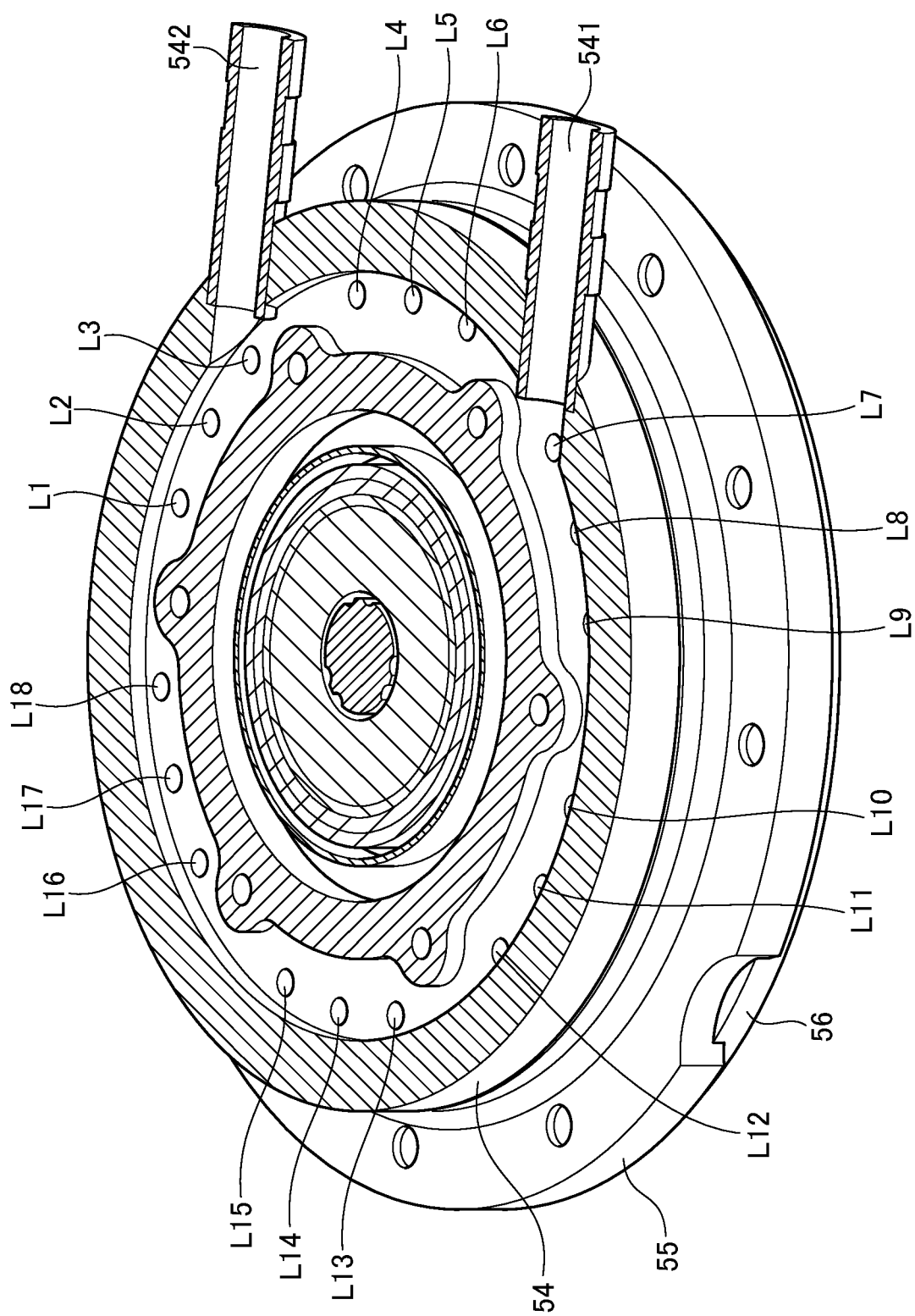
FIG. 8 is a cross-sectional view of a BB cross-section in FIG. 5.

FIG. 6 is a perspective view of the housing 54 as viewed from the upper side. FIG. 7 is a perspective view of the housing 54 as viewed from the back side. FIG. 8 is a cross-sectional view of a BB cross-section in FIG. 5. As shown in FIG. 5 and FIG. 6, the chamber CB surrounds the rotation shaft 57 for the holder 55, and has a substantially annular shape. Thereby, the chamber CB can temporarily store the process liquid around the rotation shaft 57 for the holder 55, and can supply the process liquid to the polishing surface more uniformly.

As shown in FIG. 6 to FIG. 8, the housing 54 is provided with a plurality of holes L1 to L18 that communicate with the chamber CB, that are formed on the lower surface side of the housing 54 and that are arranged substantially radially at intervals from each other. Thereby, the process liquid supplied to the chamber CB drops to the upper surface of the holder 55 through the plurality of holes L1 to L18. Thereby, it is possible to uniformly drop the process liquid from the plurality of holes L1 to L18 to the upper surface of the holder 55, and to supply the process liquid to the region on the inside of the disk 56. The process liquid sucked through the plurality of holes L1 to L18 is discharged from the discharge port 542 through the chamber CB.

Figure 9:
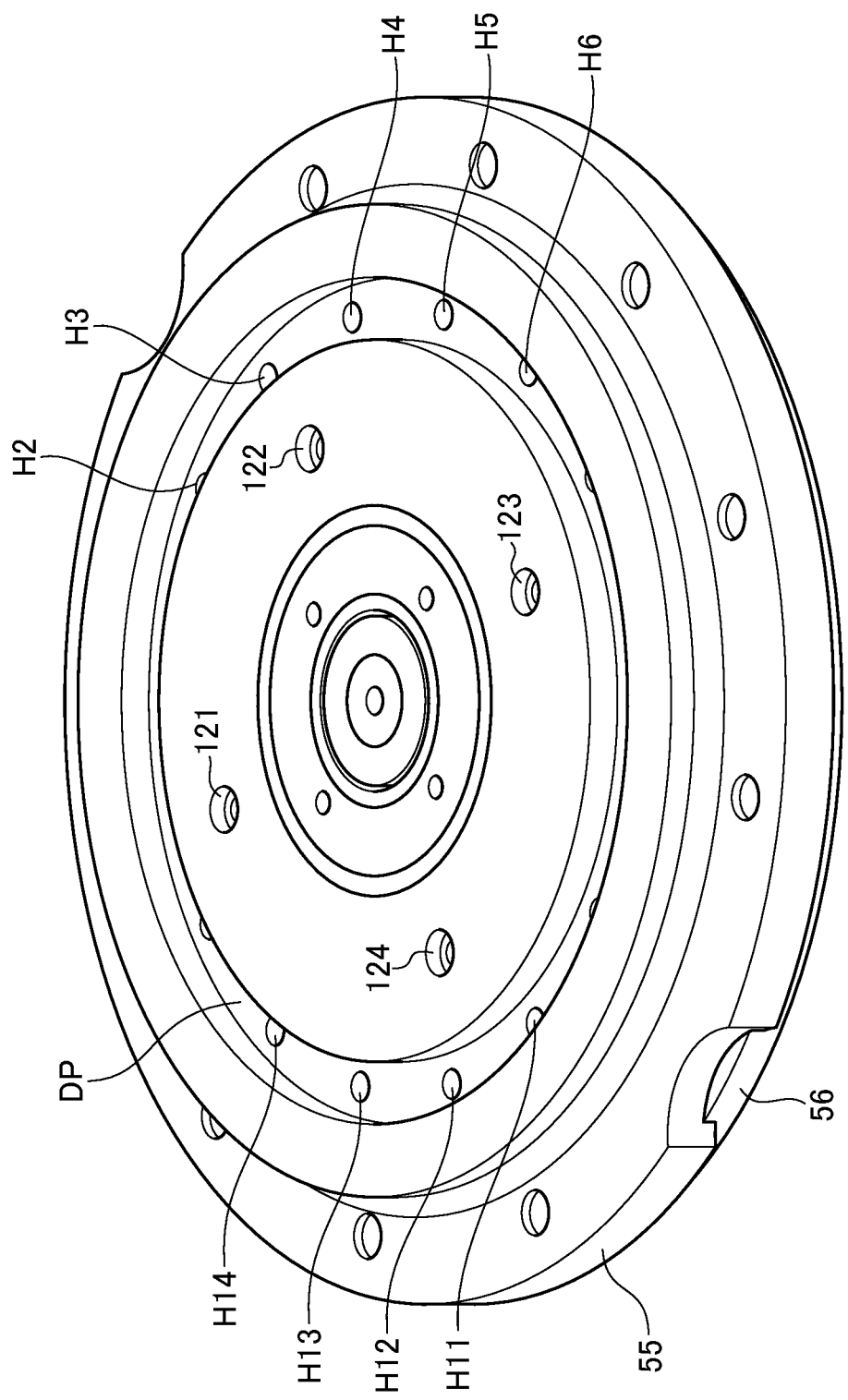
FIG. 9 is a perspective view of the holder 55.
Figure 10:
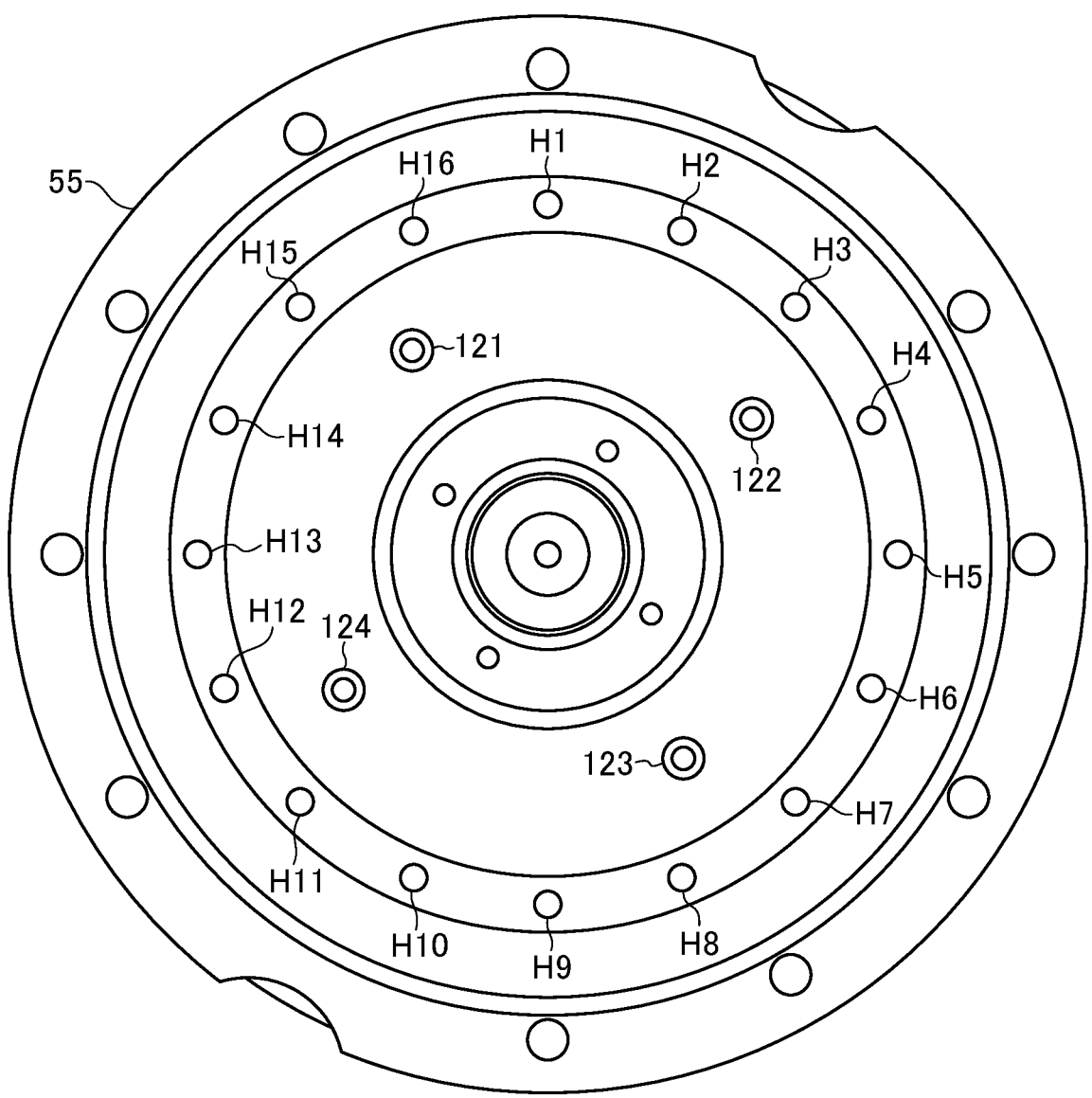
FIG. 10 is a plan view of the holder 55 as viewed from the upper side.

FIG. 9 is a perspective view of the holder 55. FIG. 10 is a plan view of the holder 55 as viewed from the upper side. As shown in FIG. 9 and FIG. 10, on the holder 55, holes 121 to 124 are radially formed. Furthermore, on the outer side of the holder 55, a plurality of holes H1 to H16 that are arranged substantially radially at intervals from each other are formed. Further, as shown in FIG. 9, an annular groove DP that communicates with the plurality of holes H1 to H16 is formed on the upper surface side of the holder.

In this way, the holder 55 is rotatable, the disk 56 is coupled to the lower surface side of the holder 55, and a plurality of first flow passages each of which passes, to the upper surface, from the lower surface inside the outer edge of the opening of the disk 56 are formed. In the embodiment, as an example, each first flow passage is formed by one of the holes H1 to H16 and the groove DP, and in total, 16 first flow passages are formed.

Figure 11:
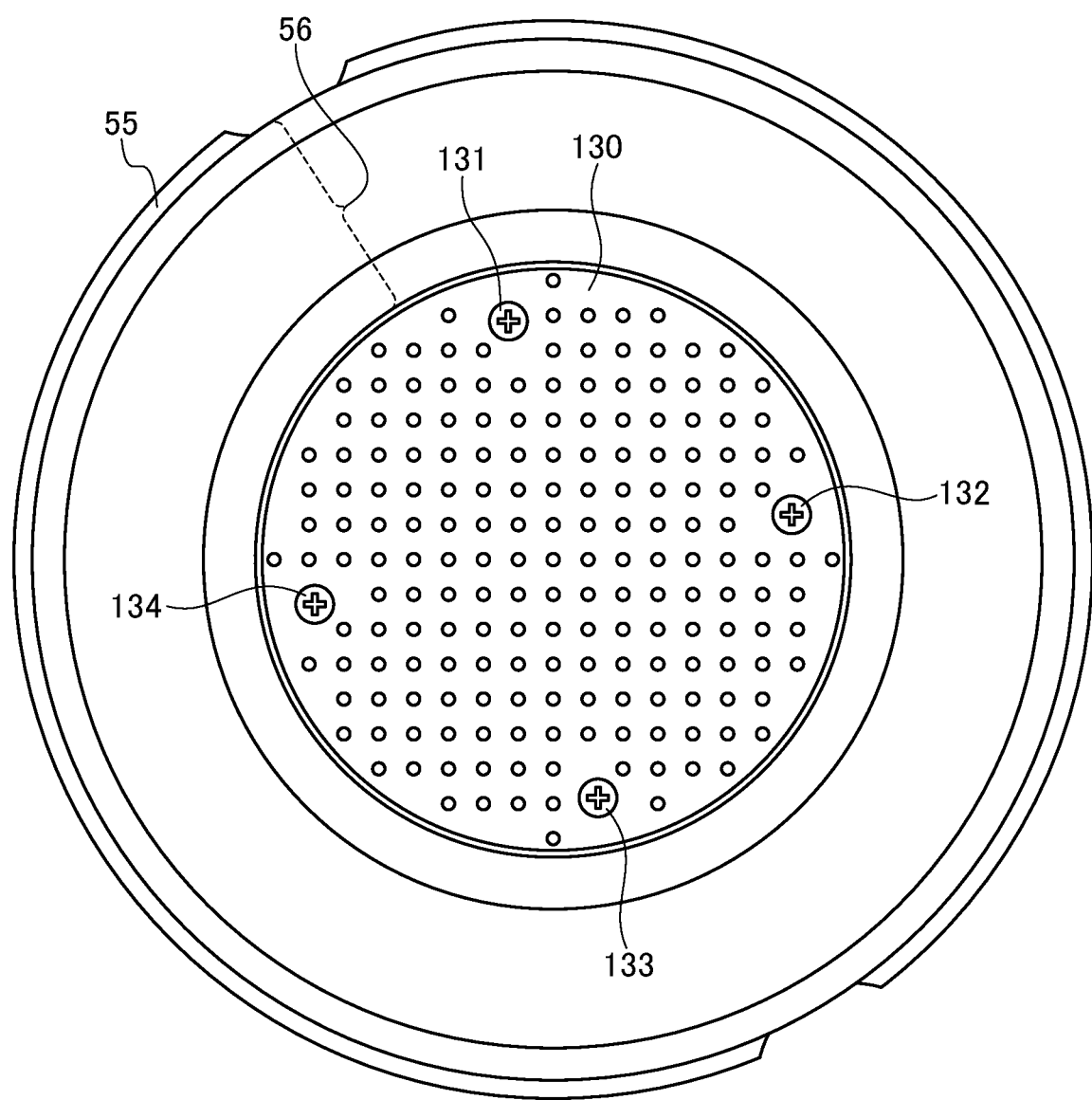
FIG. 11 is a plan view of the holder 55 as viewed from the lower side.

FIG. 11 is a plan view of the holder 55 as viewed from the lower side. As shown in FIG. 11, the annular disk 56 is fixed to the lower surface of the holder 55. As shown in FIG. 11, a straightening plate 130 is fixed to the lower surface side of the holder 55, by screws 131 to 134. Each of the screws 131 to 134 is fixed to the corresponding one of the hole 121 to 124 (see FIG. 10), so that the straightening plate 130 is fixed. On the straightening plate 130, a plurality of holes are formed substantially evenly.

Figure 12:
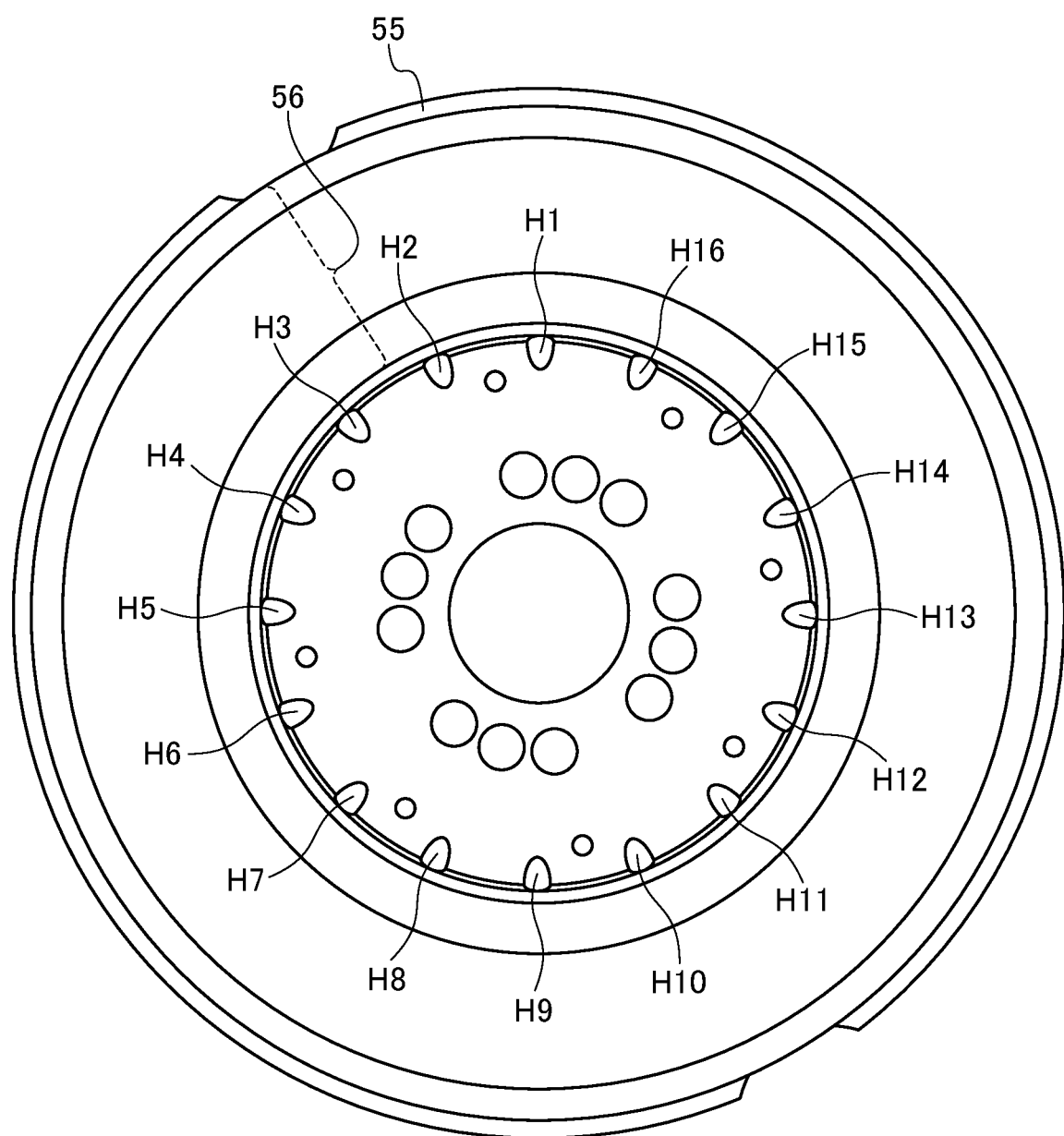
FIG. 12 is a plan view when the straightening plate 130 is removed in FIG. 11.

FIG. 12 is a plan view when the straightening plate 130 is removed in FIG. 11. As shown in FIG. 12, one end of each of the holes H1 to H16, which is a part of the first flow passage, is exposed on the inside of the disk 56.

In this way, the straightening plate 130 that is provided with the plurality of holes and that covers the opening of the first flow passage is provided on the lower surface side of the holder 55. Thereby, when the process liquid is supplied to the polishing surface, the process liquid, after passing through the first flow passage, is supplied to the polishing surface through the straightening plate 130. Thereby, the process liquid dropped from the first flow passage drops from the plurality of holes formed on the straightening plate 130, so that the process liquid is supplied to the polishing surface more uniformly. Further, when the process liquid is sucked from the polishing surface, the process liquid, after passing through the straightening plate 130, is sucked through the first flow passage. Thereby, it is possible to constantly suck the process liquid on the polishing surface evenly in the circumferential direction, and it is possible to suck the process liquid from the polishing surface more uniformly.

Figure 13:
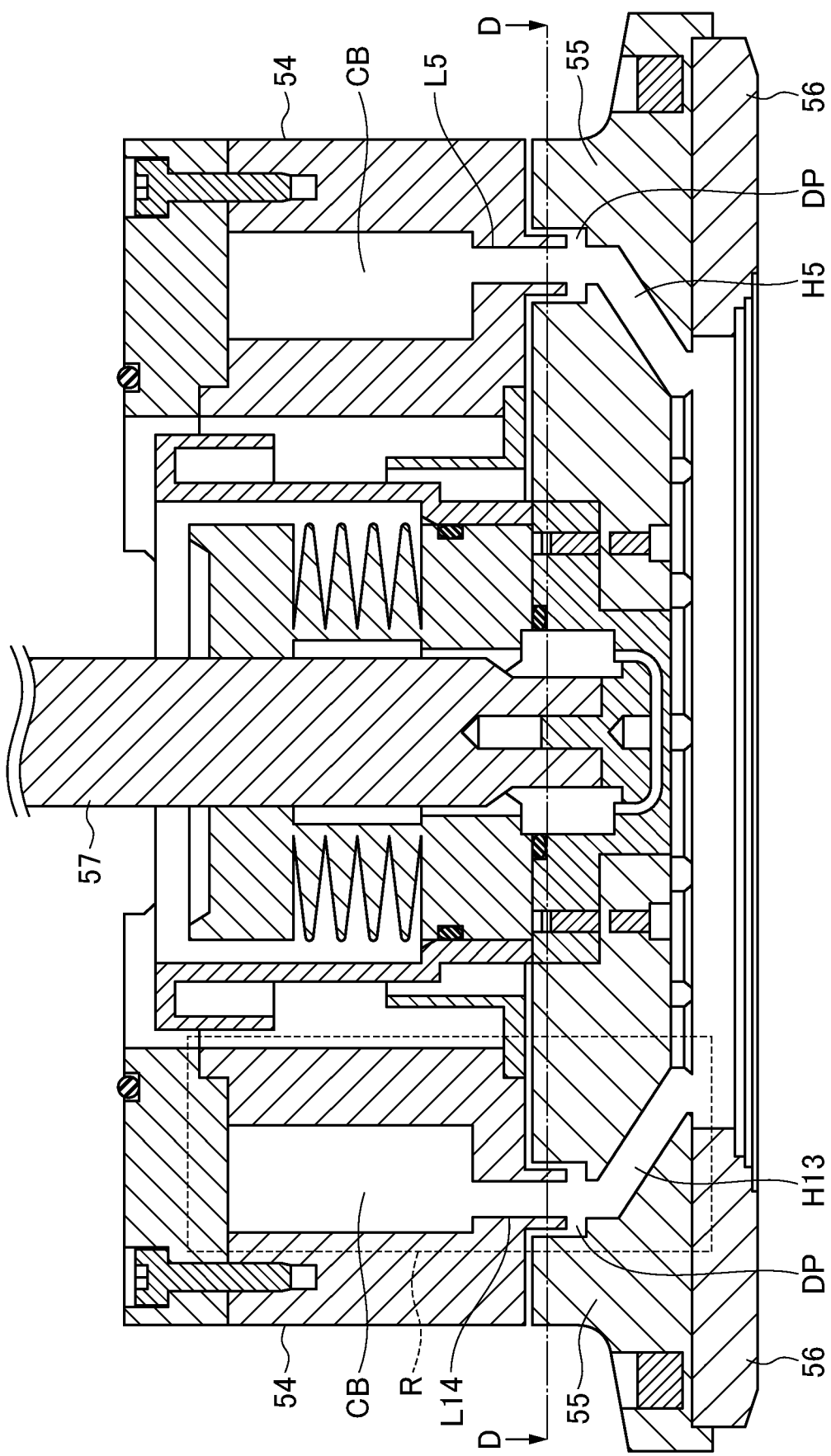
FIG. 13 is a cross-sectional view of a CC cross-section in FIG. 5.

FIG. 13 is a cross-sectional view of a CC cross-section in FIG. 5. As shown in FIG. 13, the holder 55 is rotatable around the rotation shaft 57, the disk 56 is coupled to the lower surface side of the holder 55, and the first flow passage that passes, to the upper surface, from the lower surface inside the outer edge of the opening of the disk 56 is provided.

As shown in FIG. 13, the first flow passage is inclined o as to be closer to the rotation shaft 57 of the holder 55 as it goes to the lower surface side. Thereby, it is possible to smoothly supply the process liquid in the direction of the rotation shaft 57.

As shown in FIG. 13, the housing 54 is provided with a distance from the upper surface of the holder 55. The second flow passage is provided in the interior of the housing 54, and the housing 54 is fixed such that the opening of the second flow passage faces the upper surface of the holder 55. The second flow passage is connected with the supply source 41 and the suction source 42 of the process liquid.

In the housing 54, the chamber CB capable of temporarily storing the process liquid is provided on the second flow passage. In this way, in the embodiment, as an example, the second flow passage is formed by one of the holes L1 to L16 and the chamber CB, and in total, 16 second flow passages are formed. Thereby, it is possible to continuously supply the process liquid stored in the chamber CB, to the polishing surface. Further, it is possible to continuously discharge the process liquid stored in the chamber CB, to the exterior.

During the operation of the dresser 33, the rotation shaft 57 rotates at a predetermined rotation speed, so that the holder 55 rotates. Therefore, at certain timings, the hole L14 of the second flow passage faces the hole H13 of the first flow passage as shown in the cross-sectional view of FIG. 13, but at many other timings, the hole L14 of the second flow passage does not face the hole H13 of the first flow passage. Therefore, when the process liquid is supplied to the polishing surface, at many timings, the process liquid dropped through the second flow passage is once received by the groove DP. Then, the process liquid moves horizontally along the groove DP, and drops from one of the holes H1 to H16.

Figure 14:
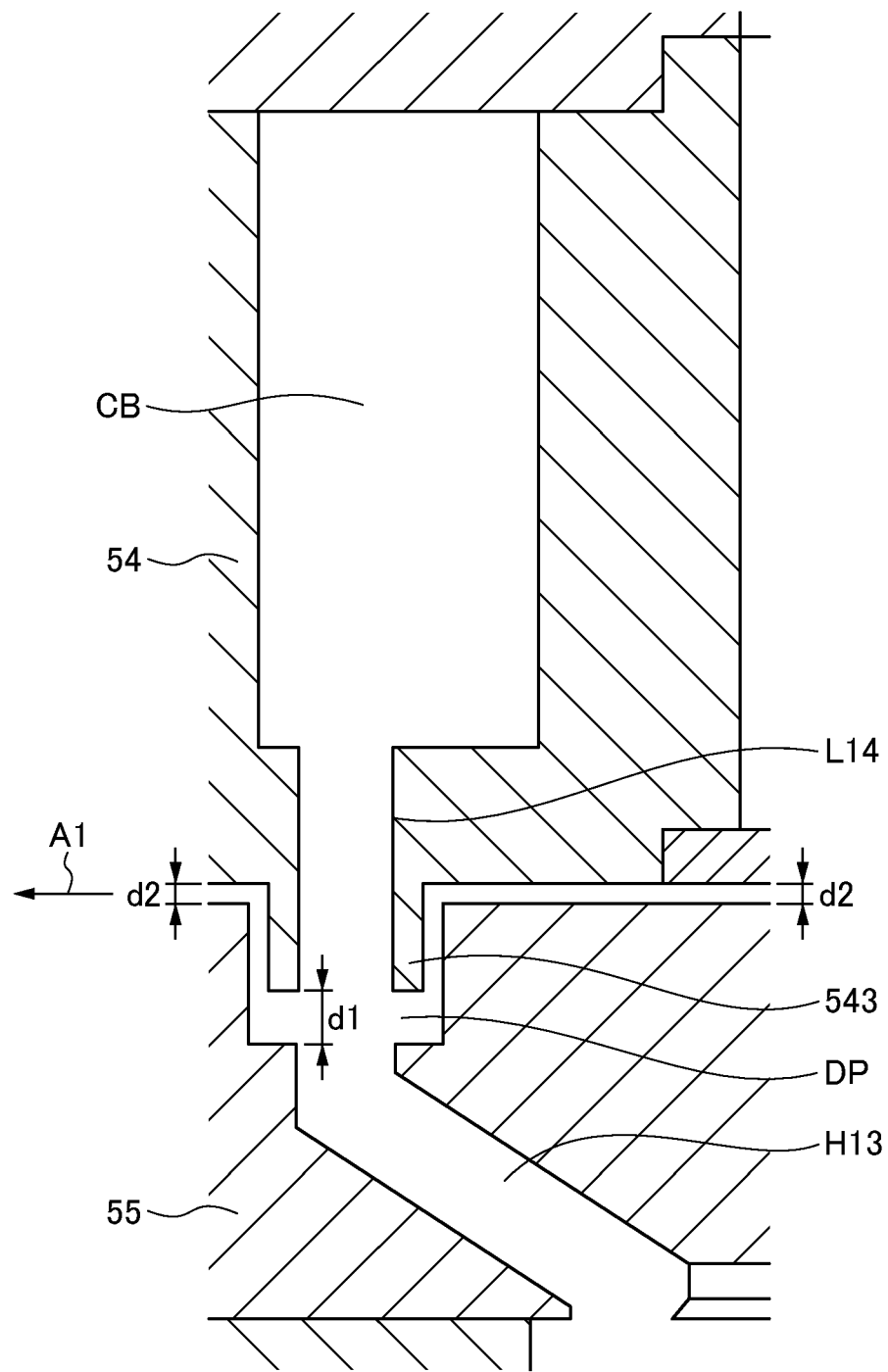
FIG. 14 is an enlarged view of a region R in FIG. 13.
Figure 15:
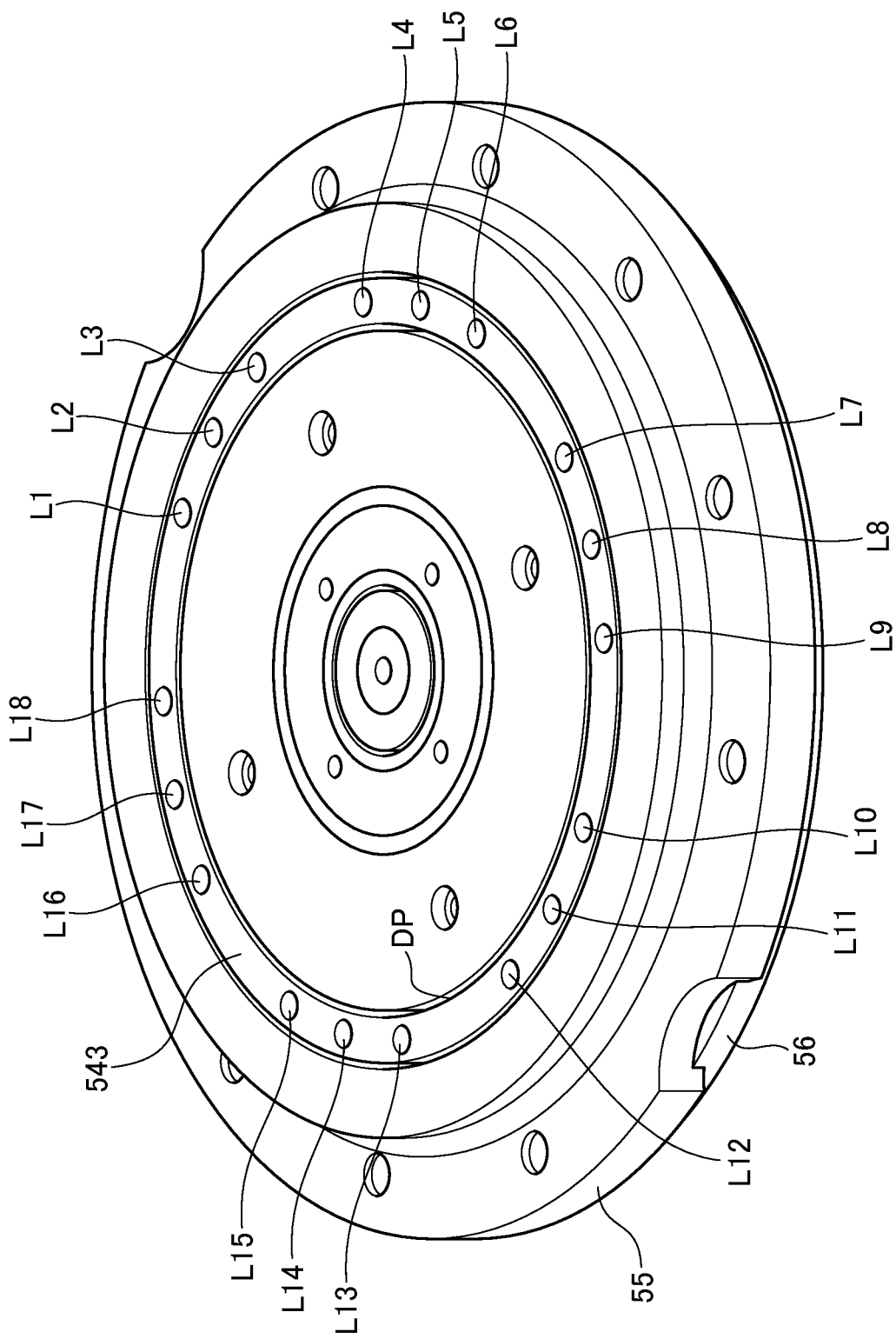
FIG. 15 is a cross-sectional view of a DD cross-section in FIG. 13.

FIG. 14 is an enlarged view of a region R in FIG. 13. FIG. 15 is a cross-sectional view of a DD cross-section in FIG. 13. In U.S. Pat. No. 6,508,697, since the seal between the hole provided on the cover and the rotation shaft of the dresser deteriorates due to the polishing liquid, there is a problem in that the maintenance frequency increases. On the other hand, in the embodiment, the housing 54 includes a projecting portion 543 that forms the opening of the second flow passage and that projects downward, as shown in FIG. 14. The groove DP that forms a part of the first flow passage and that surrounds at least a part of the periphery of the projecting portion 543 is formed on the upper surface side of the holder 55.

According to this configuration, between the downward projecting portion 543 of the housing 54 and the groove of the holder 55, a labyrinth structure with a downward convex shape and a concave shape is formed, and a non-contact seal is configured. Thereby, as long as the flow rate is regulated such that a pressure exceeding a pressure corresponding to the depth of the groove DP is not generated in the downward flow passage in the holder, it is possible to supply the process liquid without the overflow from the groove DP. Further, since a contact seal is not provided between the first flow passage and second flow passage through which the polishing liquid passes, the deterioration of the contact seal does not occur, and the maintenance frequency can be reduced.

Even if the process liquid overflows from between the holder 55 and the housing 54, it is possible to supply the process liquid to the circumference of the dresser 33, along the upper surface inclined portion of the holder 55, and therefore, it is possible to uniformly supply the process liquid to the pad surface, compared to the conventional supply method. Furthermore, as the supply of the process liquid for dressing, it is possible to perform both the supply of the process liquid from the interior of the dresser 33 through the holder 55 and the supply of the process liquid to the circumference of the dresser 33 by the overflow of the process liquid from between the holder 55 and the housing 54, and it is possible to uniformly supply the process liquid in a wide range and in the vicinity of the dressing process surface.

Specifically, as shown in FIG. 15, the groove DP is provided in an annular shape, and the projecting portion 543 is also provided in an annular shape. The projecting portion 543 penetrates into the groove DP, and the groove DP and the projecting portion 543 face each other at an interval. Thereby, it is possible to surely drop the process liquid into the groove DP, and it is possible to avoid the process liquid from flowing to the exterior (in the direction of an arrow A1).

A distance d1 between the end of the projecting portion 543 and the bottom of the groove DP is longer than a distance d2 between a portion of the lower surface of the housing 54 where the projecting portion 543 is not provided and the upper surface of the holder 55. Thereby, it is possible to avoid the process liquid from flowing out of the groove DP (in the direction of the arrow A1), by keeping the process liquid in the groove DP as much as possible.

Figure 16:
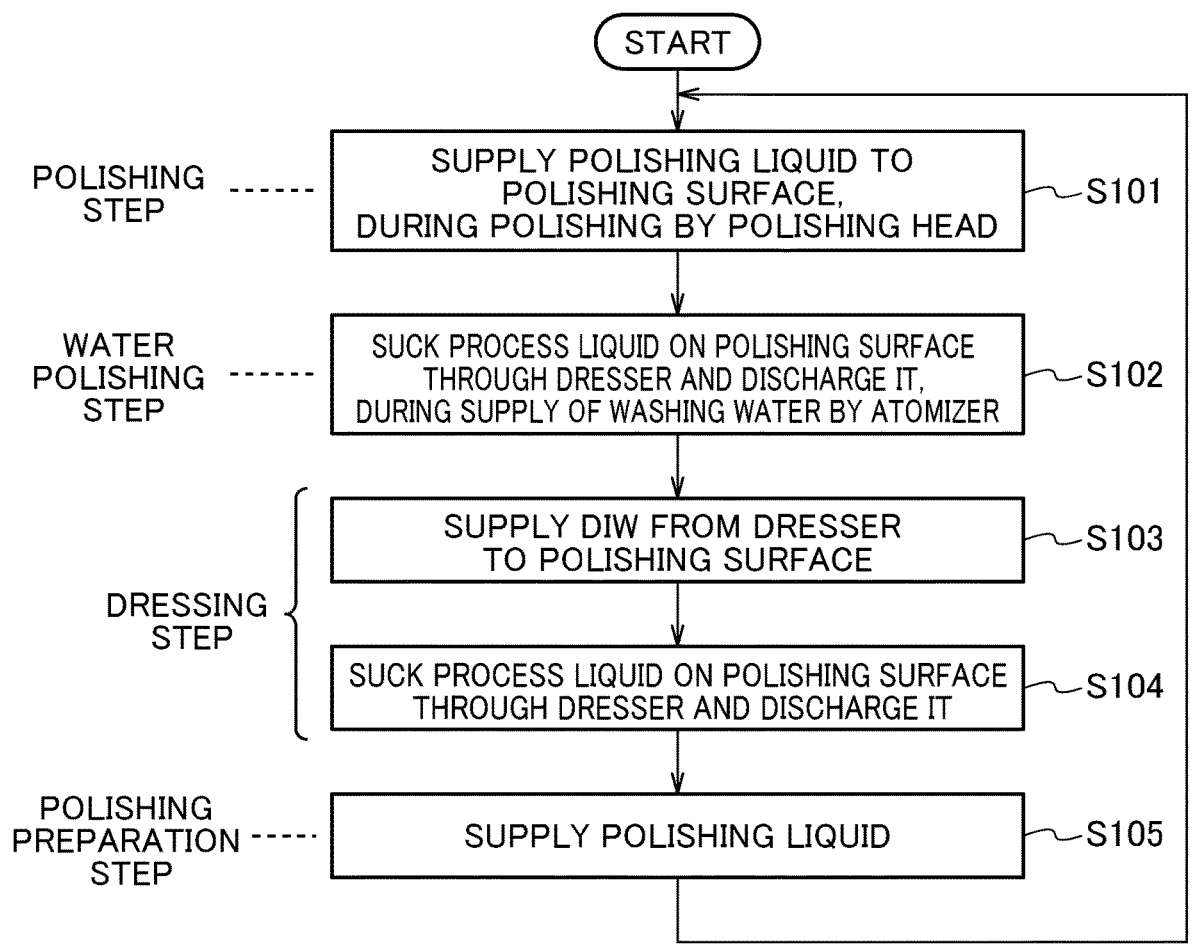
FIG. 16 is a flowchart showing an exemplary process method according to the embodiment.

FIG. 16 is a flowchart showing an exemplary process method according to the embodiment.

(Step S101) First, in a polishing step, during the polishing by the polishing head 31A, 31B, 31C or 31D, the polishing liquid is supplied from the dresser 33A, 33B, 33C or 33D to the polishing surface. Thereby, it is possible to supply the polishing liquid while performing a light dressing.

(Step S102) Next, in a water polishing step, during the supply of the washing water by the atomizer 34A, 34B, 34C or 34D, the dressers 33A, 33B, 33C or 33D sucks the process liquid containing dressing dregs and/or polishing dregs, from the polishing surface, and discharges the process liquid, while the dresser 33A, 33B, 33C or 33D scans the polishing surface.

(Step S103) Next, in a dressing step (pad conditioning step), during the dressing, the dresser 33A, 33B, 33C or 33D supplies the pure water (DIW) to the polishing surface, while the dresser 33A, 33B, 33C or 33D scans the polishing surface.

Here, during the dressing, in some cases, the washing water is supplied by the atomizer 34A, 34B, 34C or 34D. In that case, the dresser 33A, 33B, 33C or 33D may suck the process liquid containing dressing dregs and/or polishing dregs, from the polishing surface, and may discharge the process liquid.

(Step S104) Next, in the final step of the dressing step (pad conditioning step), during the dressing, the dresser 33A, 33B, 33C or 33D sucks the process liquid on the polishing surface and discharges the process liquid, while the dresser 33A, 33B, 33C or 33D scans the polishing surface. Thereby, the water on the polishing surface is removed, and therefore, it is possible to shorten the time for the replacement of the water on the polishing surface with the polishing liquid. Further, since the water on the polishing surface is removed, it is possible to prevent the polishing liquid from being unnecessarily diluted. Thereby, it is possible to reduce the supply quantity of the polishing liquid and shorten the time for the supply of the polishing liquid in the next polishing preparation step, and it is possible to contribute to the enhancement of the productivity.

(Step S105) Next, in the polishing preparation step (a preload step for the polishing liquid), the polishing liquid is supplied from the polishing liquid supply nozzle 32A, 32B, 32C or 32D to the polishing surface. Here, the polishing liquid may be supplied from the dresser 33A, 33B, 33C or 33D to the polishing surface. After the process of step S105, the process flow returns to the process of step S101, and the processes of steps S101 to S105 are repeated.

Thus, the dressing device 40 according to the embodiment includes the disk 56 that includes the opening on the inside and that sets the polishing surface for polishing the substrate. Further, the dressing device 40 includes the rotatable holder 55, that has the disk 56 coupled to the lower surface side, and that is provided with the first flow passage passing from the lower surface inside the outer edge of the opening of the disk 56 to the upper surface. Further, the dressing device 40 includes the housing 54 that is provided with a distance from the upper surface of the holder 55, that is provided with the second flow passage in the interior, that is fixed such that the opening of the second flow passage faces the upper surface of the holder 55, and that has the second flow passage connected with the supply source 41 and the suction source 42 of the process liquid. The process liquid is supplied from the supply source 41 to the polishing surface, through the second flow passage and the first flow passage in order, and the process liquid on the polishing surface is sucked by the suction source 42, through the first flow passage and the second flow passage in order.

According to this configuration, the holder 55 can be detached from the dressing device 40, and therefore, even if the polishing liquid sticks to the first flow passage in the holder 55, the polishing liquid can be easily removed. Further, the housing 54 can be detached from the dressing device 40, and therefore, even if the polishing liquid sticks to the second flow passage in the housing 54, the polishing liquid can be easily removed. Therefore, the maintenance property for the removal of the polishing liquid is enhanced. Further, since the seal is not provided between the first flow passage and second flow passage through which the polishing liquid passes, the deterioration of the seal does not occur, and the maintenance frequency can be reduced. Further, pipes (for example, hoses) to be connected with the supply source 41 and the suction source 42 are connected with the fixed housing, and therefore, it is not necessary to dispose a rotary joint on the rotation shaft for the holder 55. Accordingly, it is possible to dispose the cylinder, which is a member for generating the pressing force on the rotation shaft for the holder 55, and therefore, it is possible to smoothly control the pressing force. Furthermore, the inside of the outer edge of the opening of the disk 56 tends to have a negative pressure due to the suction by the suction source 42, and a pressing force by which the surface of the disk 56 follows the polishing surface is generated. Therefore, it is possible to expect the enhancement of the dressing efficiency. Further, it is possible to perform the suction from the inside of the outer edge of the opening of the disk 56, and therefore, it is possible to enhance the efficiency of the removal of the polishing liquid and debris stuck near the center.

The dressing method according to the embodiment includes the step of supplying the pure water to the polishing surface, through the second flow passage and the first flow passage in order, during the dressing, as shown in step S103 of FIG. 16, and the step of sucking the process liquid on the polishing surface, through the first flow passage and the second flow passage in order, during the dressing.

Thereby, it is possible to supply the process liquid during the dressing, and therefore, it is possible to perform the stable supply of the water quantity to the dressing process point. Therefore, it is possible to expect the enhancement of the dressing effect, and it is possible to contribute to the enhancement of the productivity. Further, since the process liquid is sucked during the dressing, it is possible to remove the debris on the polishing pad 10. It is possible to efficiently perform the conditioning of the surface of the polishing pad 10, to reduce the residue of scratch sauce, and to contribute to the enhancement of the productivity.

The dressing method according to the embodiment includes the step of supplying the polishing liquid to the polishing surface, through the second flow passage and the first flow passage in order, during the polishing by the polishing head, as shown in step S101 of FIG. 16. Furthermore, the dressing method according to the embodiment includes the step of sucking the process liquid on the polishing surface, through the first flow passage and the second flow passage in order, during the supply of the washing water by the atomizer, as shown in step S102 of FIG. 16.

Thereby, it is possible to supply the polishing liquid while performing a light dressing. Further, during the supply of the washing water by the atomizer, it is possible to suck the process liquid containing dressing dregs and/or polishing dregs, from the polishing surface, and discharge the process liquid.

Here, the housing 54 according to the embodiment includes the two ports of the supply port 541 and the discharge port 542, but without being limited to this, may include a single united port that functions as both the supply port 541 and the discharge port 542. In that case, the dressing device 40 according to the embodiment may be configured as shown in FIG. 17.

Figure 17:
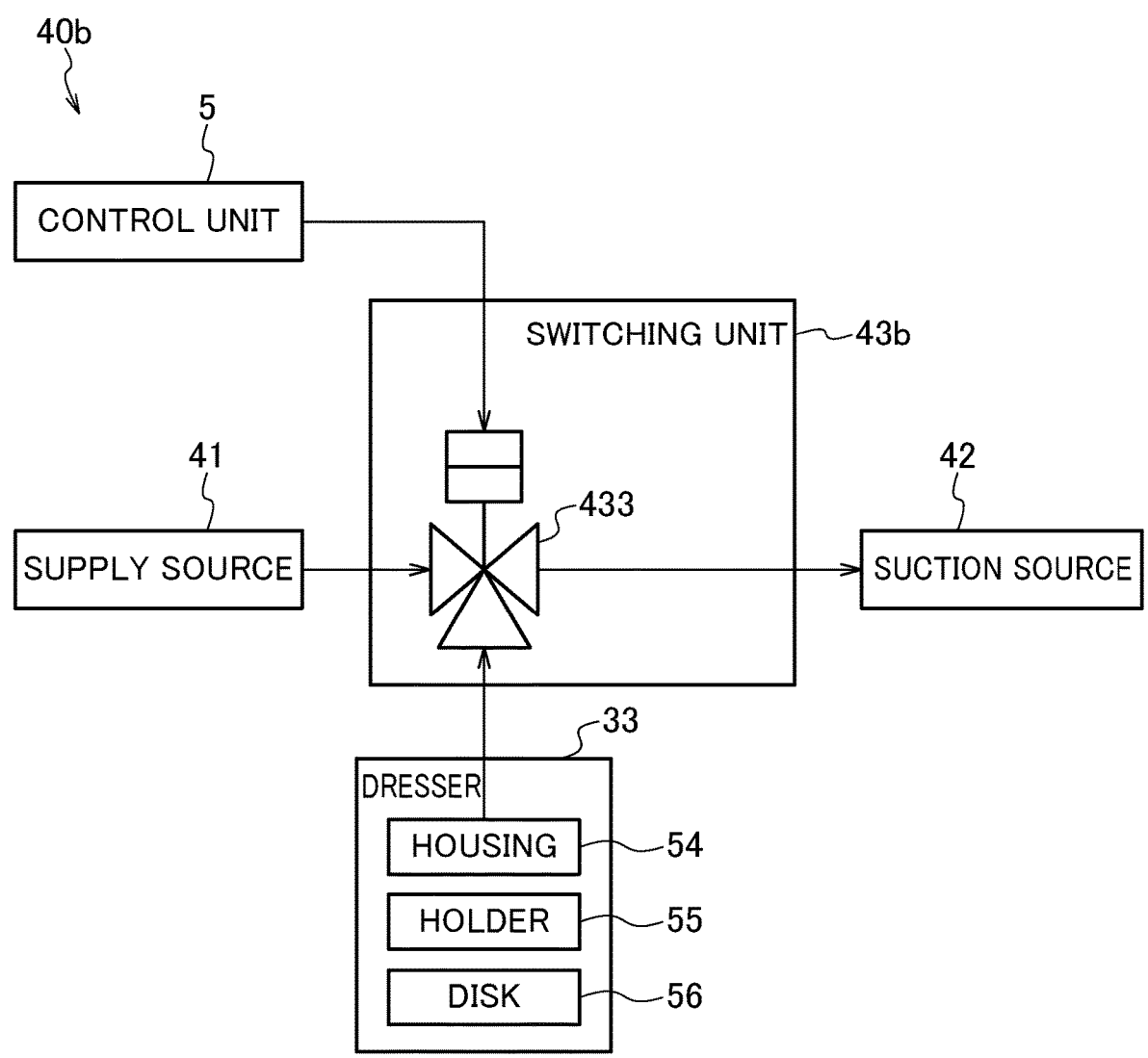
FIG. 17 is a configuration diagram showing the outline of a dressing device according to a modification of the embodiment.

FIG. 17 is a configuration diagram showing the outline of a dressing device according to a modification of the embodiment. As shown in FIG. 17, compared to the dressing device 40 according to the embodiment, in a dressing device 40b according to the modification, the switching unit 43 is changed into a switching unit 43b. The switching unit 43b includes a three-way valve 433 that is connected with the supply source 41, the suction source 42 and the above united port of the housing 54 of the dresser 33. The control unit 5 controls the three-way valve 433 such that the second flow passage of the housing 54 communicates with either the supply source 41 or the suction source 42.

Thus, the technique is not limited to the above embodiment itself, and can be realized by modifying constituent elements in the implementation phase, in a range without departing from the spirit. Further, various techniques can be formed by appropriate combinations of the plurality of constituent elements disclosed in the above embodiment. For example, some constituent elements of all constituent elements shown in the embodiment may be excluded. Furthermore, among different embodiments, constituent elements may be appropriately combined.

What is claimed is:

1. A dressing device comprising:
   a disk that has an opening on an inside;
   a rotatable holder, the disk being coupled to a lower surface side of the holder, the holder being provided with a first flow passage that passes from a lower surface to an upper surface, the lower surface being inside an outer edge of the opening of the disk; and
   a housing that is provided with a distance from the upper surface of the holder, the housing being provided with a second flow passage in an interior, the housing being fixed such that an opening of the second flow passage faces the upper surface of the holder, the second flow passage being connected with a supply source and a suction source of process liquid,
   wherein the second flow passage and the first flow passage provide a pathway for process liquid to be supplied from the supply source to the polishing surface, and wherein the first flow passage and the second flow passage also provide a reverse pathway for a suction of the process liquid from the polishing surface by the suction source, wherein the housing includes a projecting portion that forms the opening of the second flow passage and that projects downward, and a groove is formed on an upper surface side of the holder, the groove forming a part of the first flow passage and surrounding at least a part of a periphery of the projecting portion.

2. A dressing device comprising:

a disk that has an opening on an inside;

a rotatable holder, the disk being coupled to a lower surface side of the holder, the holder being provided with a first flow passage that passes from a lower surface to an upper surface, the lower surface being inside an outer edge of the opening of the disk;

a housing that is provided with a distance from the upper surface of the holder, the housing being provided with a second flow passage in an interior, the housing being fixed such that an opening of the second flow passage faces the upper surface of the holder, the second flow passage being connected with a supply source and a suction source of process liquid; and a switching unit that switches a communication point of the second flow passage of the housing between the supply source and the suction source, wherein the second flow passage and the first flow passage provide a pathway for process liquid to be supplied from the supply source to the polishing surface, and wherein the first flow passage and the second flow passage also provide a reverse pathway for a suction of the process liquid from the polishing surface by the suction source.

3. The dressing device according to claim 2, further comprising a control unit that controls the switching unit such that the second flow passage of the housing communicates with either the supply source or the suction source.

4. A dressing device comprising:

a disk that has an opening on an inside;

a rotatable holder, the disk being coupled to a lower surface side of the holder, the holder being provided with a first flow passage that passes from a lower surface to an upper surface, the lower surface being inside an outer edge of the opening of the disk; and a housing that is provided with a distance from the upper surface of the holder, the housing being provided with a second flow passage in an interior, the housing being fixed such that an opening of the second flow passage faces the upper surface of the holder, the second flow passage being connected with a supply source and a suction source of process liquid, wherein the second flow passage and the first flow passage provide a pathway for process liquid to be supplied from the supply source to the polishing surface, and wherein the first flow passage and the second flow passage also provide a reverse pathway for a suction of the process liquid from the polishing surface by the suction source, wherein the housing includes a chamber that is provided on the second flow passage of the housing, the chamber being capable of temporarily storing the process liquid.

5. The dressing device according to claim 4, wherein the housing further includes a plurality of holes that are formed on a lower surface side of the housing and being arranged substantially radially at intervals from each other, the plurality of holes communicating with the chamber, and a plurality of the second flow passages are provided, each of the plurality of the second flow passages being formed by one of the holes and the chamber.

6. The dressing device according to claim 4, wherein the chamber surrounds a rotation shaft for the holder and has a substantially annular shape.

7. The dressing device according to claim 1, wherein a plurality of holes are formed on the holder, the plurality of holes being arranged substantially radially at intervals from each other, the groove communicates with the plurality of holes and has an annular shape, a plurality of the first flow passages, each of the plurality of the first flow passages being formed by one of the holes and the groove, and a distance between an end of the projecting portion and a bottom of the groove is longer than a distance between a portion of a lower surface of the housing and the upper surface of the holder, the portion of the lower surface of the housing being a portion where the projecting portion is not provided.

8. The dressing device according to claim 1, wherein the first flow passage is inclined so as to be closer to a rotation shaft of the holder as it goes to the lower surface side.

9. The dressing device according to claim 1,

Wherein the holder includes a straightening plate that is provided on the lower surface side of the holder, the straightening plate being provided with a plurality of holes and covering the opening of the first flow passage.

10. The dressing device according to claim 1, further comprising a rotatable rotation shaft, wherein the holder is coupled to the rotation shaft in a detachable manner.

11. The dressing device according to claim 1, further comprising a turnable arm, wherein the housing is coupled to the arm in a detachable manner.

12. A polishing apparatus comprising:

a table configured to hold a polishing pad;

a polishing head configured to hold a substrate and slidingly contact the table; and the dressing device according to claim 1 configured to dress a surface of the polishing pad.

13. A holder that is a component to be used together with a housing fixed in a dressing device, the holder comprising:

a connect portion that connects with a disk, the connect portion being located on a lower surface side of the holder, wherein a flow passage that passes from a lower surface to an upper surface of the holder is provided in the holder, and wherein the flow passage is a pathway for a suction of a process liquid from the lower surface to the upper surface, and a size of an annular groove formed on a first side of the holder facing the housing is larger than a size of each of a plurality of holes formed on a second side of the holder facing the disk.

14. A housing that is a component to be used together with a holder that is rotatable in a dressing device, wherein the housing is provided with a distance from an upper surface of the holder, the housing is provided with a flow passage in an interior, the housing is fixed such that one end of the flow passage faces the upper surface of the holder, and the flow passage is connected with a supply source and a suction source of process liquid, wherein the flow passage is a common pathway for a supply of a liquid from the supply source and a suction of the liquid by the suction source, and a chamber is provided on the flow passage and a projection portion projecting from a bottom surface of the housing is provided and a hole formed in the projection portion is in communication with the chamber such that the hole is a part of the flow passage.

15. The holder according to claim 13, wherein the plurality of holes and the annular groove communicate with each other, wherein a width of the annular groove is larger than a diameter of each of the plurality of holes.

* * * * *